United States Patent
Blug

(10) Patent No.: US 10,664,630 B2
(45) Date of Patent: May 26, 2020

(54) METHOD, DATA PROCESSING ARRANGEMENT AND COMPUTER PROGRAM PRODUCT FOR RETROFITTING AN ELECTRICAL ENERGY NETWORK AND METHOD FOR OPTIMIZING AN EXISTING ELECTRICAL ENERGY NETWORK

(71) Applicant: SIEMENS AKTIENGESELLSCHAFT, Munich (DE)

(72) Inventor: Christian Blug, Quierschied (DE)

(73) Assignee: Siemens Aktiengesellschaft, Munich (DE)

( * ) Notice: Subject to any disclaimer, the term of this patent is extended or adjusted under 35 U.S.C. 154(b) by 232 days.

(21) Appl. No.: 15/223,885

(22) Filed: Jul. 29, 2016

(65) Prior Publication Data
US 2017/0032065 A1   Feb. 2, 2017

(30) Foreign Application Priority Data
Jul. 29, 2015 (EP) .................................. 15178794

(51) Int. Cl.
  *G06F 30/18* (2020.01)
  *H02J 3/38* (2006.01)
  *G06F 30/20* (2020.01)

(52) U.S. Cl.
  CPC .............. *G06F 30/18* (2020.01); *G06F 30/20* (2020.01); *H02J 3/381* (2013.01);
  (Continued)

(58) Field of Classification Search
  CPC .... G06F 17/509; G06F 17/5009; H02J 3/381; H02J 2003/007; Y02E 60/76; Y04S 40/22
  (Continued)

(56) References Cited

U.S. PATENT DOCUMENTS

2009/0276170 A1*  11/2009  Bickel ..................... H02J 3/00
                                                              702/58
2014/0265574 A1   9/2014  Tyler et al.
(Continued)

FOREIGN PATENT DOCUMENTS

WO    2010057516 A1   5/2010
WO    2012037989 A2   3/2012
WO    2014152408 A2   9/2014

*Primary Examiner* — Kamini S Shah
*Assistant Examiner* — Faraj Ayoub
(74) *Attorney, Agent, or Firm* — Laurence Greenberg; Werner Stemer; Ralph Locher

(57) ABSTRACT

A method retrofits an existing electrical energy network with additional controllable devices for transmitting energy. A model of the energy network is provided, the model takes into account a voltage distribution inside the energy network by a system of equations and/or a system of inequations on the basis of the number and position of additional controllable devices and on the basis of control positions of all controllable devices. The model is used to carry out a simulation for minimizing a target function. The target function takes into account retrofitting effort and/or energy losses caused by the additional controllable devices, and in which the number and position of additionally required controllable devices and the control positions of all controllable devices are stated as a result of the simulation so that the energy network complies with a predefined voltage band during operation.

9 Claims, 12 Drawing Sheets

(52) U.S. Cl.
CPC ........... *H02J 2203/20* (2020.01); *Y02E 60/76* (2013.01); *Y04S 40/22* (2013.01)

(58) Field of Classification Search
USPC .......................................................... 703/18
See application file for complete search history.

(56) References Cited

U.S. PATENT DOCUMENTS

2015/0088439 A1* 3/2015 Coffrin .................. G01R 21/06
702/60
2016/0156226 A1* 6/2016 Itaya ........................ H02J 3/14
323/234

* cited by examiner

METHOD, DATA PROCESSING ARRANGEMENT AND COMPUTER PROGRAM PRODUCT FOR RETROFITTING AN ELECTRICAL ENERGY NETWORK AND METHOD FOR OPTIMIZING AN EXISTING ELECTRICAL ENERGY NETWORK

CROSS-REFERENCE TO RELATED APPLICATION

This application claims the priority, under 35 U.S.C. § 119, of European application EP 15178794.2, filed Jul. 29, 2015; the prior application is herewith incorporated by reference in its entirety.

BACKGROUND OF THE INVENTION

Field of the Invention

In public energy networks, for example energy distribution and energy transmission networks, the maintenance of the voltage quality is coming to the fore more and more on account of the greatly heterogeneous load and producer structure caused by decentralized energy producers. It is necessary to comply with the standard EN 50160, for example, which requires a voltage band of +/−10% of the nominal voltage of the energy network for all network operating situations. This is becoming more and more difficult with the conventional control methods (static control in the local network stations (ONS) and the substations). Therefore, controllable local network transformers (RONT) or network controllers are increasingly being used. One example of this problem and accordingly used controllable local network transformers and network controllers is found in the lecture "Pilotprojekte zur Spannungsregelung im NS-Netz der Thüringer Energie", VDE symposium, Meissen Sep. 18, 2013, by Dipl.-Ing. Torsten Roscher, Thüringer Energie AG in Erfurt.

The products and their installation sites are selected on the basis of field tests or operational empirical values. Coordination with the control devices which are still present in the network must be dispensed with on account of the complexity or is carried out only in a rudimentary manner by means of tests. Therefore, such a procedure is not optimal either operationally or economically. In order to arrive at a result which is optimal both under the aspect of energy losses and under the aspect of investment costs when planning an energy network, all control devices (desired value in the substation, construction or non-construction of medium-voltage network controllers, adjustment of the tap changers in the conventional local network stations, replacement of selected local network station transformers with controllable local network transformers, installation of network controllers in the low voltage) would have to be taken into account for all relevant operating situations.

Controllable local network transformers are offered by numerous manufacturers, the different devices differing in terms of their possibilities for controlling the voltage, the procurement and maintenance costs and the design-related energy losses. Controllable local network transformers are generally priced between € 22,000 and € 25,000 and therefore are currently approximately twice as expensive as conventional local network transformers. Therefore, the use and installation site of a controllable local network transformer should be accurately planned. In this case, the so-called cash value denotes the procurement costs plus cumulative operating costs over the planned operating duration of an item of equipment, for instance a transformer.

With regard to the operation-related energy loss of the various device types, test measurements must generally be carried out in various operating situations. In this case, an increased energy loss on account of a more complicated design must often be accepted in the case of a high degree of flexibility, for example if many different control stages are provided on a transformer.

For example, the information brochure "Die intelligente Ortsnetzstation—Ein wichtiger Smart Grid-Baustein", SEEDEFOSMARKTKIOSK_12-12_1.1 from 2012 from Schneider Electric Energy GmbH discloses, on page 7, a local network transformer which can be electronically controlled in an infinitely variable manner.

The product information "FITformer® REG—Der regelbare Ortsnetztransformator", order no. E50001-G640-A220-V2, TH 101-140819 DB 10140.3 from 2014 discloses a three-stage transformer.

Network controllers are known, for example, from the product information "Netzregler" from Walcher GmbH & Co. KG. The product information "Magtech-Netzregler: Spezialist für Netzausläufer mit Photovoltaik-Anlagen" also discloses a network controller.

International patent disclosure WO 2012/037989 A1 discloses a method for the computer-assisted distribution of energy in a decentralized energy network, in which improved control of active powers provided at various points of the energy network by a mathematical optimization method during operation of the energy network is proposed. In this case, in particular, the energy consumption and the energy supply of decentralized energy consumers and energy producers, respectively, are controlled by evaluating measured values.

Furthermore, international patent disclosure WO 2010/0357516 A1 discloses a method for determining electrical load flows in an electrical energy supply network, load profiles of consumers being dynamically adapted during operation of the energy supply network using measured values.

In this case, it has hitherto been conventional to investigate only partial aspects with regard to the planning of an energy network during planning on account of the complexity of a typical energy network and its controllable devices. For this purpose, possible locations of controllable local network transformers are predefined as part of a few variants devised by a planner and are evaluated with the aid of load flow simulations. On account of the large number of possible solutions, partial aspects or correlations between the aspects must be entirely disregarded in this procedure in order to achieve a result in a finite time.

Alternatively, lengthy field tests or measurements for assisting with the finding of a solution have also been carried out for a long time.

On the basis of known approaches for planning an electrical energy network having controllable devices for transmitting energy, the invention is based on the technical object of specifying a method for retrofitting the energy network, which method enables a high voltage quality even with increased decentralized energy supply with comparatively little retrofitting effort and/or low energy losses.

SUMMARY OF THE INVENTION

The invention achieves this object by a method for retrofitting an existing electrical energy network with additional controllable devices for transmitting energy, in which a model of the energy network is provided. The model takes into account a voltage distribution inside the energy network by a system of equations and/or a system of inequations on the basis of the number and position of additional controllable devices and on the basis of control positions of all controllable devices, and the model is used to carry out a simulation for minimizing a target function. The target function takes into account retrofitting effort and/or energy losses caused by the additional controllable devices, and in which the number and position of additionally required controllable devices and the control positions of all controllable devices are stated as the result of the simulation so that the energy network complies with a predefined voltage band during operation.

Within the scope of the invention, controllable devices can be understood as meaning devices which can be used to control a voltage. For example, a controllable local network transformer is a controllable device. In this case, a control position is, for example, a tap position of a local network transformer which can be controlled in a stepwise manner. The control position generally indicates the extent to which (for example +3.5%) the controllable device is intended to deviate from its normal value (for example in the low-voltage range 230 V=100%) for the output voltage.

In this case, the existing energy network can already contain controllable devices for transmitting energy, to which yet further additional controllable devices are intended to be retrofitted in order to comply with the predefined voltage band during operation of the energy network.

In the simplest case, the model of the energy network takes into account only a voltage distribution and therefore generally differs from load flow models or network models, as are usually used in network planning.

The control settings of existing control devices and the locations/control settings of new required control devices are selected in this case in such a manner that the target function is minimized.

Retrofitting effort in the sense of the invention is effort which arises, for example, when existing transformers are replaced with controllable local network transformers by appropriate personnel. In this case, at least the network part arranged downstream of the existing transformer must be disconnected in order to carry out the conversion. This means a reduced availability of the energy network for customers, which is disadvantageous. In addition, the control positions of other controllable devices must also be adapted, which likewise results in personnel expenditure, costs and reduced availability. As will become clear, the term retrofitting effort comprises the time and costs needed to convert the energy network on the basis of the simulation result. The retrofitting effort is generally smallest if only the smallest possible number of controllable devices has to be replaced and if only the smallest possible number of existing controllable devices has to be provided with another control position.

Energy losses in the sense of the invention are losses of electrical energy in the controllable devices which are produced, for example, in a transformer which is operated with a predefined control position.

An important advantage of the method according to the invention is that, as a result of the target function being minimized, it is possible to carry out optimization which results in particularly little effort, low energy losses and low costs for the retrofitting. In contrast, additional reactive power sources are often used during conventional retrofitting of an energy network, but this results in higher currents in the energy network and therefore also in larger network losses.

In one preferred embodiment of the method according to the invention, a linear system of equations and/or system of inequations is used. This is an advantage because it is possible, in this manner, to use a mathematical model which can be solved efficiently and comparatively quickly or a simulation which formulates the voltage conditions as a linear system of (in)equations on the basis of the control positions of all existing control devices and control devices to be newly installed. Powerful solvers are already available for the calculation. When evaluating the model, it is possible to use, for example, the free solver lp_solve which is available for download on the Internet at numerous addresses.

In another preferred embodiment of the method according to the invention, the result is used to retrofit the additionally required controllable devices at the stated position in the energy network. In this case, the control position of the controllable device and of all further controllable devices which are already present is generally also adjusted according to the result, which effects optimal coordination of existing and new voltage control devices.

In another preferred embodiment of the method according to the invention, a substation transformer with a controllable output voltage and/or local network transformers which can be controlled in a stepwise manner and/or local network transformers which can be controlled in an infinitely variable manner and/or network controllers are used as controllable devices. This is an advantage because the different controllable devices can each be used to adapt the voltage at a different level, the different controllable devices differing considerably in terms of their flexibility with regard to the voltage control (for example the number of stages and percentage spread of the stages) and the price.

In this case, within the scope of the invention, local network transformers which can be controlled in a stepwise manner are devices whose output voltage can be adjusted in stages. For example, three stages with 96%, 100% and 104% of the normal value for the output voltage are possible. However, there are also local network transformers which can be controlled in an infinitely variable manner and in which a network controller is connected downstream of a local network transformer, for example, on the low-voltage side of the latter and can change the output voltage in an infinitely variable manner between 0 and 7%. Such a local network transformer which can be controlled in an infinitely variable manner is known from the company MagTech, for example.

Network controllers are transformers whose input voltage and output voltage are at the same voltage level. They can therefore be used in the low-voltage range and in the medium-voltage range to control the voltage.

In another preferred embodiment of the method according to the invention, the predefined voltage band is +/−10% of a predefined nominal voltage of the energy network. This is an advantage because this is a permissible voltage band often required according to different standards. In principle, however, the method according to the invention can take into account all voltage bands of different widths if this is specifically required.

In another preferred embodiment of the method according to the invention, the target function is minimized by use of mixed-integer optimization. This is an advantage because mixed-integer optimization can be used to quickly and easily find a solution. The method according to the invention therefore arrives at the result quickly and with comparatively little computing effort for the simulation.

In another preferred embodiment of the method according to the invention, a branch & bound method is used as the mixed-integer optimization. This is an advantage because branch & bound methods are widespread and are tried and tested.

In another preferred embodiment of the method according to the invention, a specific type of device from a specific manufacturer is stated as the result for each additional controllable device. This is an advantage because different device types from different manufacturers differ considerably in terms of their technical capabilities and costs. For example, it is cheaper and often also requires less maintenance during operation to use a simpler transformer having only three stages instead of a more complex transformer having five stages if a three-phase tap changer also suffices at the position in the energy network indicated in the result.

On the basis of known approaches for planning an electrical energy network having controllable devices for transmitting energy, the invention is also based on the technical object of specifying a data processing arrangement for retrofitting the energy network, which arrangement enables a high voltage quality even with increased decentralized energy supply with comparatively little retrofitting effort and/or low energy losses.

On the basis of known approaches for planning an electrical energy network having controllable devices for transmitting energy, the invention is also based on the technical object of specifying a computer program product, by which the method according to the invention can be used in a data processing device.

The invention achieves this object by means of a computer program product. In this case, the same advantages as those explained at the outset for the method according to the invention analogously result for the computer program product according to the invention.

On the basis of known approaches for planning an electrical energy network having controllable devices for transmitting energy, the invention is also based on the technical object of specifying a method for optimizing the energy network for operating situations with a large decentralized supply, which method enables a high voltage quality with little effort.

A device which can be dynamically controlled under load may be, for example, a substation transformer, a network controller or a controllable local network transformer. The method according to the invention has the advantage that optimized control positions can be found for the existing controllable devices and the substation transformer, for example, even without retrofitting controllable devices, which control positions allow the energy network to comply with a predefined voltage band even in the case of a particularly large decentralized supply.

In one preferred and advantageous embodiment of the method, the device which can be dynamically controlled under load and the other controllable devices in the energy network are adjusted with the control positions according to the result.

In another preferred and advantageous embodiment of the method, a substation transformer which can be dynamically controlled for different operating situations of the energy network is used as the device which can be dynamically controlled under load, with the result that wide-range control of the voltage in the energy network can be carried out. This is an advantage because the situation of a heavy load and the situation of intense supply to the energy network can be handled particularly safely in this manner without violating a predefined voltage band.

Other features which are considered as characteristic for the invention are set forth in the appended claims.

Although the invention is illustrated and described herein as embodied in a method, a data processing arrangement and a computer program product for retrofitting an electrical energy network and a method for optimizing an existing electrical energy network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
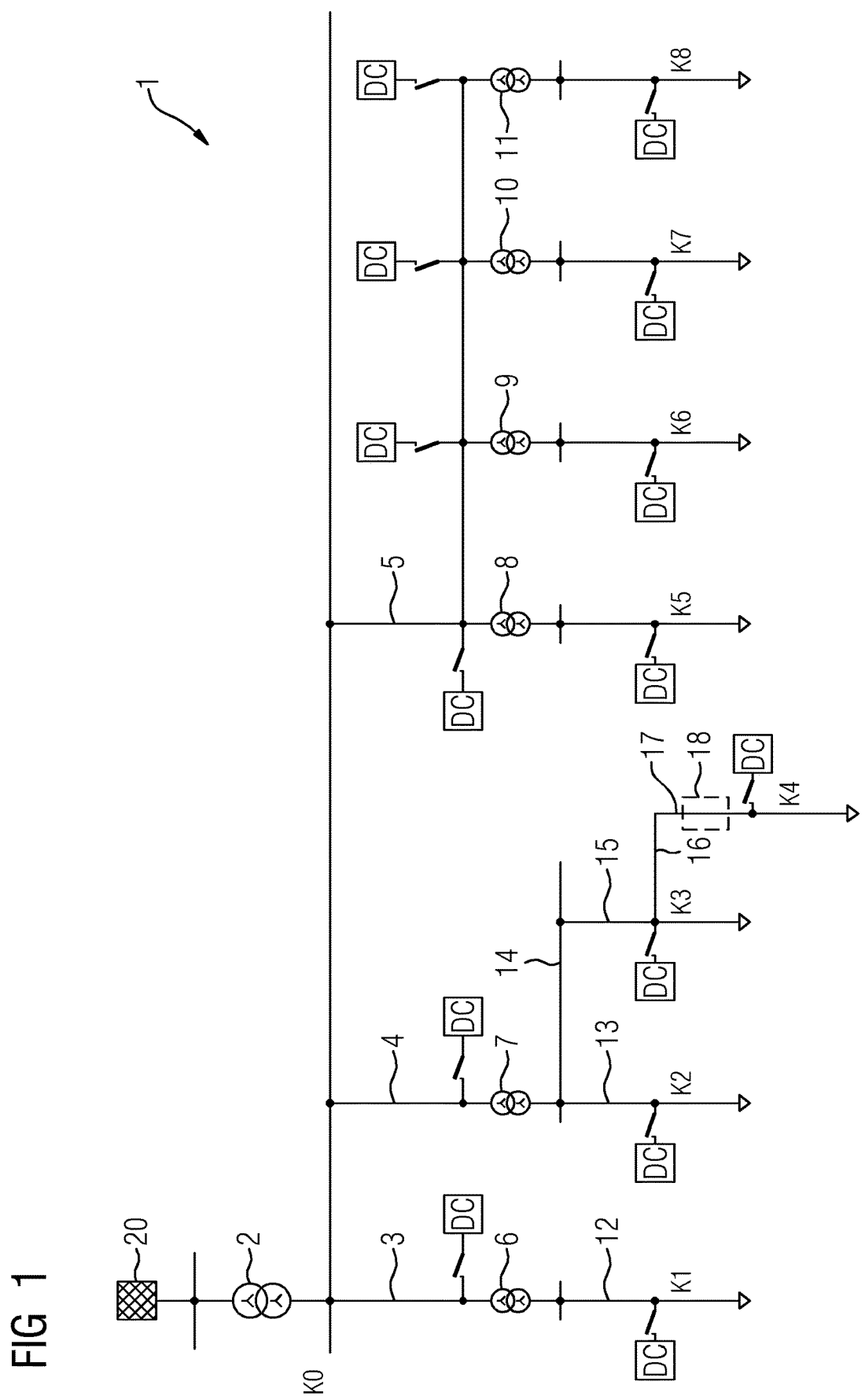
FIG. 1 is a schematic illustration of an exemplary energy network having controllable devices for transmitting energy according to the invention.

A method of the invention is evaluated using a representative exemplary network and its effectiveness has been verified.

The method makes it possible to comprehensively consider all voltage control elements or controllable devices and therefore enables complete coordination of all control elements for the first time: for example, the tap positions of the statically controlled local network stations are selected and are matched to the voltage control in the substation in such a manner that only a minimum number of new control devices such as controllable local network transformers and/or network controllers is required. This is advantageous because costs can be saved.

The method makes it possible to analytically determine those locations or positions in the energy network at which new network control elements are most useful. The method makes it possible to evaluate when network controllers and when controllable local network transformers should be used. Furthermore, the most favorable providers of network control elements can be selected on the basis of costs and control ranges of the devices, with the result that only minimal costs arise for the network operator as a result of retrofitting.

The method according to the invention can be used, for example, for network studies relating to voltage control concepts or as a tool for optimally designing controllable local network transformers (determination and assessment of the technically/economically required static and dynamic controllable local network transformer stages). Furthermore, customer-specific control technology projects can be planned using the method according to the invention. In this case, the method according to the invention can be provided as a software solution, for example.

Various controllable devices are provided for the simulation:

Siemens FITformer

This solution combines a tap changer which can be actuated without a current on the high-voltage side (+/−2.5/5%) with a contactor which can be actuated under load on the low-voltage side. Its control range is symmetrical and has a load control range of +/−3.57% or +/−4.35%. The variable transformation ratio is achieved via taps of the winding on the secondary side.

MR GridCon iTap

This solution from MR Reinhausen is likewise based on the principle of inductive transmission. In this case, the gradation is effected via a tap changer which can be actuated under load on the high-voltage side. Symmetrical or asymmetrical operation can be achieved here with up to 9 stages, depending on the requirement.

Magtech Magnetically Controllable Local Network Transformer

In the case of this solution, the magnetic flux density in the iron core is influenced by a constant magnetic field which is additionally coupled in. The flux density and therefore the induced voltage can be adjusted in an infinitely variable manner on the basis of this principle.

Network Controller

Network controllers are a further possible way of keeping the network voltage within the permissible limits. This is likewise understood as meaning an inductive voltage controller which is incorporated, for example, in the line of a long spur cable in order to control the network voltage of the nodes in this spur. In this case, there are both medium-voltage-side and low-voltage-side solutions. Such a network controller is used selectively and must be designed only for an accordingly lower power in comparison with the controllable local network transformer or substation transformer, with the result that cost advantages may result here. So-called voltage boosters have been used in the past to compensate for excessively high voltage drops in the case of long spur lines in the distribution network.

Medium-Voltage Network Controller

In this case, an autotransformer from the company Siemens is connected into a branch in order to compensate for the voltage differences. A price of approximately € 110,000 to € 140,000 is mentioned here.

Low-Voltage Network Controller

Such a network controller from the company Walcher likewise operates according to the inductive transmission principle and consists of transformer cascades for each phase. The price of this depends on the power, but a price of € 16,000 is mentioned for a selected solution.

With regard to the objective of the simulation:

The network voltage may likewise be influenced by a decrease in or production of inductive reactive power by the decentralized producers. In this case, currently decentralized producers with a connection point at the medium-voltage level must be able to deliver their active power in "underexcited" and "over-excited" form with a power factor of cos ϕ=0.95. In this case, the under-excited operation is generally of greater relevance. Such operation can be associated with greater line utilization and additional network losses if consumer reactive power, in particular, is not compensated for. It is now clear that the individual options of operational voltage control need to be coordinated in the sense of optimal network operation, but also a network structure with optimal costs.

A method which relates to the handling of the following questions is described below:

a) What is the most cost-effective design of the tap changers in the conventional local network stations?
b) At what locations in the network must controllable local network transformers or network controllers be used?
c) How many controllable local network transformers or network controllers need to be used in the network?
d) What desired voltage value must be set in the substation transformer?
e) Is a uniform desired value sufficient or does dynamic control (for example compound control) need to be used to control the voltage in the substation?
f) What must dynamic voltage control look like?
g) When can a network controller be used instead of a controllable local network transformer?
h) What budgets result for conventional expansion measures into the primary technology instead of investing in voltage controllers or controllable local network transformers?

The following statements are intended to be verified using an exemplary energy network (FIG. 1) which already contains typical network structures, however.

The exemplary network 1 is illustrated in FIG. 1 and has the following typical distribution network structures:

a) A high-voltage supply 20 supplies a medium-voltage level K0 having three line spurs 3, 4, 5 via a transformer 2 in the substation.
b) Transformers 6 to 11 are provided for the purpose of supplying the low-voltage level, which transformers can indeed be switched in a stepwise manner but not under load (dynamic).

c) A simple line spur 3 with a decentralized feeder DC (for example a wind power plant) on the medium-voltage level and a feeder DC on the low-voltage level 12 (for example a photovoltaic installation).
d) A second line spur 4 has a supply DC on the medium-voltage level and a branch 14 on the low-voltage level, thus resulting in two low-voltage outgoing circuits 13, 15. In this case, the outgoing circuit 16 is branched yet further and has a further outgoing circuit 17 with a position for which a controllable device or a transformer 18 is proposed in the method according to the invention.
e) A third line spur 5 supplies four branches containing the transformers 8 to 11.

In this case, supply devices which may be photovoltaic installations, for example, are each indicated using the symbol DC. Nodes in the medium-voltage network have the identification N and a number.

In this case, the transformer 2 illustrated and the further transformers have adjustment possibilities for controlling the voltage which must be selected in such a manner that the predefined voltage band of +/−10% of the nominal voltage can be complied with on all voltage levels in the case of different supply situations by the supply devices DC.

The problem described can be represented by an underdetermined system of equations, the degrees of freedom of which can be used to optimize a cost function to be selected. An optimization problem always has the three constituents of variables, target function and secondary conditions. In this case, decision variables for constructing controllable local network transformers or network controllers are binary decision variables and the control stages of the substation transformers, of the local network stations, of the controllable local network transformers and of the network controllers are integer variables (for example stages: −2, −1, 0, +1, +2). The integer condition can be dispensed with in infinitely variable voltage controllers.

The node voltage which changes as a result of the tap positions can be determined, in the most general case, by a load flow calculation. The load flow problem can be formulated by secondary condition equations containing the continuous variables for the node voltages and branch currents. On account of the non-linearity of the load flow equations, the required linearization results in an accordingly large amount of modeling effort. Further secondary conditions result on account of the requirement for compliance with the permissible utilization limits and the conditions with respect to the voltage quality.

Within the scope of these secondary conditions, the variables can be determined in such a manner that the target function is optimized, or is minimized in the present case. In this case, the target function is formulated as a cost function representing the sum of investments in controllable local network transformers and network controllers and the operating costs.

The optimization problem described can be solved, in principle, even under the aspect that different operating situations of the network need to be taken into account. However, the amount of modeling effort and the resulting amount of calculation effort are enormous—the amount of effort increases exponentially with the number of variables, with the result that suitable simplifications need to be made for a practical solution to the problem. This is actually possible with the present problem.

The aim of the calculation for the exemplary network 1 is to specify the control positions of all controllable devices which are already present and to determine whether a controllable local network transformer or network controller (and its control position) is actually required at the position 18.

In this case, however, the following basic assumptions must be made:
1. It is assumed that the equipment is not overloaded. In this case, the branch currents need not be modeled as variables and the problem can be reduced to the voltage problem.
2. Voltage differences across branch elements are dependent only on the power flow and not on the absolute node voltage.
3. The solution must be valid for all operating situations.
4. The set of possible operating situations can be implicitly limited by selecting representative reference operating situations: if the solution is valid for these operating situations, it is also valid for all other operating situations.

The first assumption results in a significant simplification of the problem. This is permissible since:
a) the described problem is actually a voltage problem: this is reflected especially in the applicable guidelines which focus on the voltage problem; and
b) (n−1) supply reliability for decentralized supplies is not required. Possible overloading can be handled by supply management, for example, with the result that at least overloading can be eliminated. The consideration should therefore also be carried out only for the normal switching state of the network.

The second assumption disregards the voltage dependence of the load and producer currents. This corresponds approximately to a linear load flow problem in which the load and supply currents are constant.

The fourth assumption enormously reduces the extent of the optimization problem: this can be formulated, in principle, for any desired set of operating states. Of these operating states, the following situations are now particularly important:
a) operation with maximum load and minimum supply power
b) operation with minimum load and maximum supply power.

The correctness of this approach is justified in the linearity: if the voltage conditions for these two operating situations are complied with for the determined optimization variables, they are also complied with for intermediate states. The extreme voltage values occur only in these operating situations a and b.

The absolute value of the voltage $|U|^k|$ of the node i for the kth operating situation results from a starting value (situation 0) and additional voltage differences which are mainly caused by the voltage controllers. Furthermore, the additional voltage is also caused by current-dependent voltage differences at the equipment. The load flow problem can therefore be described using the following mathematical model (equations 1-3, see annex containing the mathematical consideration).

In order to simplify the following statements, it is assumed that the supply powers and consumer loads are real. For complex powers, the same statement tends to result. Equation (3) is therefore simplified to (equations 4-8) if a real transformation ratio on the basis of the series controller characteristic is additionally taken into account.

The first sum in equation 8, the linearization term, describes the voltage differences caused by the non-linearity with respect to the value $|u(0)|$. With a uniform constant power character, the linearization term must be analyzed more closely. In this case, it can in turn be broken down into a sum containing the differential coupling resistances and containing a term with the differential inherent resistance (equation 9). The differential inherent and coupling resistances can be directly determined with the aid of the load flow calculation. The unknown values Δi(k) can be determined as follows from the node voltages of the nodes m (equations 10-13).

This then results in (equations 14, 15) for the linearization term, with the result that the voltage equations have the following form (equations 16-18).

Figure 2:
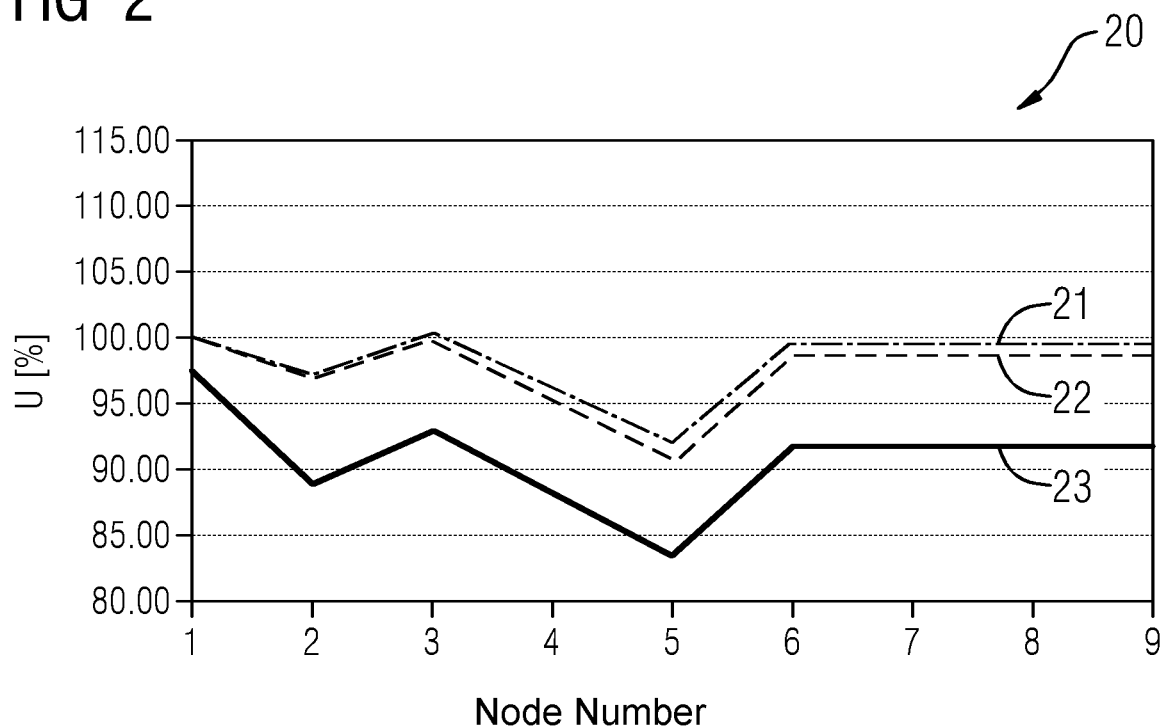
FIG. 2 is a graph showing a voltage deviation from a nominal voltage at the nodes 1 to 8 according to FIG. 1 as the simulation result with a constant power for a situation of a heavy load in the first exemplary energy network.
Figure 3:
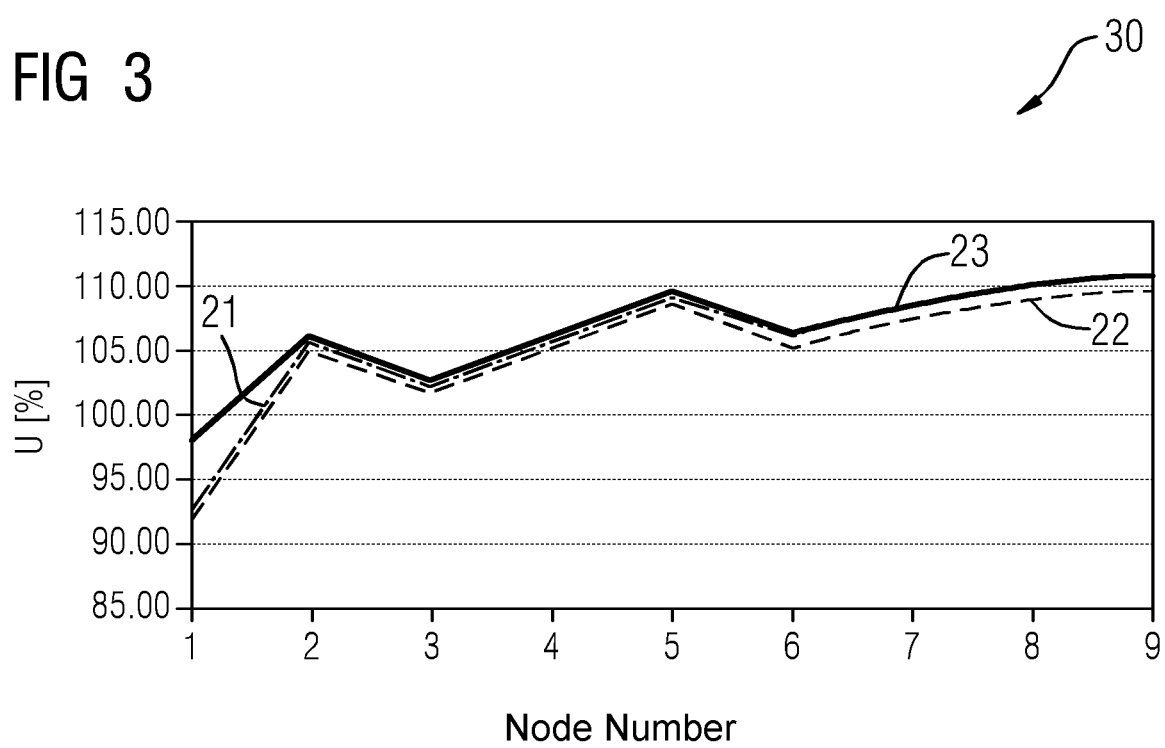
FIG. 3 is a graph showing the voltage deviation from the nominal voltage at the nodes 1 to 8 according to FIG. 1 as the simulation result with a constant power for a situation with intense supply in the first exemplary energy network.

FIGS. 2 and 3 show the percentage voltage deviations between the node voltages calculated according to the linear model 22 and those node voltages which have been determined according to network calculation program 21 using the Newton Raphson method. In this case, node voltages according to initial calculation values 23 ($|\underline{u}_i^{(0)}|$) are also represented. Initial calculation values result during the simulation at the start of finding the solution if all tap positions have been set to neutral (that is to say 100% nominal voltage on the output side of a transformer).

FIG. 2 shows a situation for the exemplary network with a high load. The tap positions have now already been selected in such a manner that the voltages are in the range +/−10%. The node voltages which have been calculated according to network calculation program 21 are exact in the case of a constant power. The difference in the voltage values between the methods 21 and 22 is very small—this shows that the use of a linear model to simplify the calculations is suitable for the invention.

Figure 4:
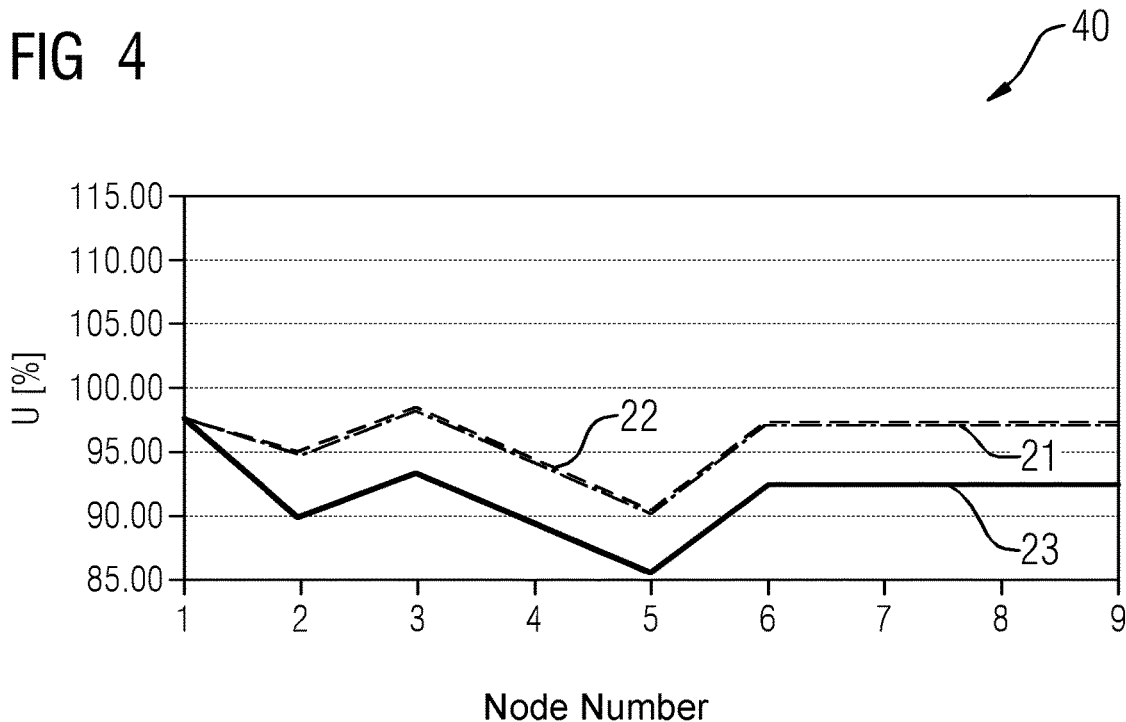
FIG. 4 is a graph showing the voltage deviation from the nominal voltage at the nodes 1 to 8 according to FIG. 1 as the simulation result with a constant current for a situation of a heavy load in the first exemplary energy network.

It is shown that the deviations of the approximation method are systematic for a heavy load (FIG. 2) and for intense production (FIG. 3): it can therefore be expected that improved results can be achieved when the linearization term is used. If the node currents are not dependent on the voltage (constant current loads or constant current supplies), the linearization term does not provide any contribution (Δi=0) and need not be considered in this situation: very good calculation results (FIG. 4) can therefore be expected for the simplified model for a constant current character of the loads and supplies. The load flow problem is therefore simplified to equations 19 and 20.

In this case, $r_j^{(k)}$ describes the control position of the jth control element, $\Delta u_j$ describes the additional voltage/control stage of this controller and $k_{i,j}$ describes a correlation factor. The constant current model is used in the further considerations.

The coefficient $k_{i,j}$ (in equation 20) describes the correlation between the voltage at the ith node and the position of the jth control element (equation 21). This variable can be determined either topologically using a width search or analytically using a correlation analysis. The latter situation results in the correlation coefficients represented in equation 23.

The value for ε should be selected to be somewhat smaller than the smallest additional voltage/control stage $\Delta u_j$. Ultimately, this approach can be used to set up a linear system of equations for determining the node voltages on the basis of the controller settings. This then represents the load flow problem as the secondary condition equations. Control can be carried out continuously or discretely. In the case of the discrete gradation, the tap position and the additional voltage/stage should be formulated as secondary conditions, for example equations 23-30.

The voltage conditions of EN 50160 can be easily introduced as additional linear secondary conditions: equations 31-33. It goes without saying that the limits must also be harsher under certain circumstances if reserves are intended to be taken into account.

The decision variables stipulate the need for a controllable local network transformer or a network controller. These variables are binary in nature. All local network stations are modeled as a series circuit of a conventional local network station with a tap changer and a controllable local network transformer. During optimization, the variables $r_j^{(k)}$ are determined for each operating situation and are used to derive the binary decision variables $b_j$ for a controllable local network transformer or a network controller. The conditions for this for the controllable local network transformer are: equations 34-35.

Since the tap changer of the conventional transformer cannot be switched under load, the resulting tap position must be the same for all operating situations. If this is not possible, the resulting different tap positions must be implemented using a controllable local network transformer.

The condition for the necessity for a network controller is: equations 36-37.

The target function can now be formulated (equation 38) with the aid of the decision variables obtained in this manner. The constants C correspond in this case to the investments for a controllable local network transformer or a network controller. If the costs of the corresponding control transformer are not consistent in this case—for example on account of different rated powers, individual values for the costs can also be set.

In order to determine the solution, the starting vectors of the node voltages $|\underline{u}_i^{(0)}|$ are first of all determined. This is carried out with the aid of load flow calculations for the relevant extreme situations in the case of a neutral position of all voltage control devices. This "initial calculation" provides further secondary condition equations for the node voltages.

The model obtained in this manner represents an optimization problem which can be described by linearizing the load flow problem with the aid of linear secondary conditions and a linear target function. Real, integer and binary optimization variables occur in this case. Such an optimization problem can be solved using the mathematical programming methods. On account of the integer nature of some of the variables, the method of implicit enumeration (branch & bound) can be used here. In this case, the integer conditions are initially relinquished for some of the variables and an optimum is determined with the aid of the simplex method. If this is worse than a previously found permissible solution, it is possible to dispense with further investigation of the corresponding "solution branch" without explicitly investigating the associated combinations of variables.

The solution itself can be effected using so-called solvers which expect the formulation of the problem in a standardized equation form and process the equations in the actual optimization step. The open-source solver "lp solve" (Michael Berkelaar, lp solve, 2012) is used for the following calculations. Although this solver reaches its performance limit more quickly than commercially available solvers such as cplex or Xpress, lp solve is absolutely sufficient for the problem presented in this paper. In the exemplary networks, the total computing time is in the range of 200 ms, with the result that an acceptable computing speed can also be expected with lp solve even in the case of realistic network sizes and therefore a larger number of variables.

Alternatively, other global optimization methods could also be used, as was carried out during network planning and network protection, for example. The combinational-heuristic methods described there are advantageous when the non-linearities cannot be ignored or when the number of variables and the associated range of values become too large.

This is not expected with the present problem. Rather, precisely the independence of the solution method from the problem allows simple adaptation by modifying the systems of (in)equations, with the result that various problems can be easily handled.

Figure 5:
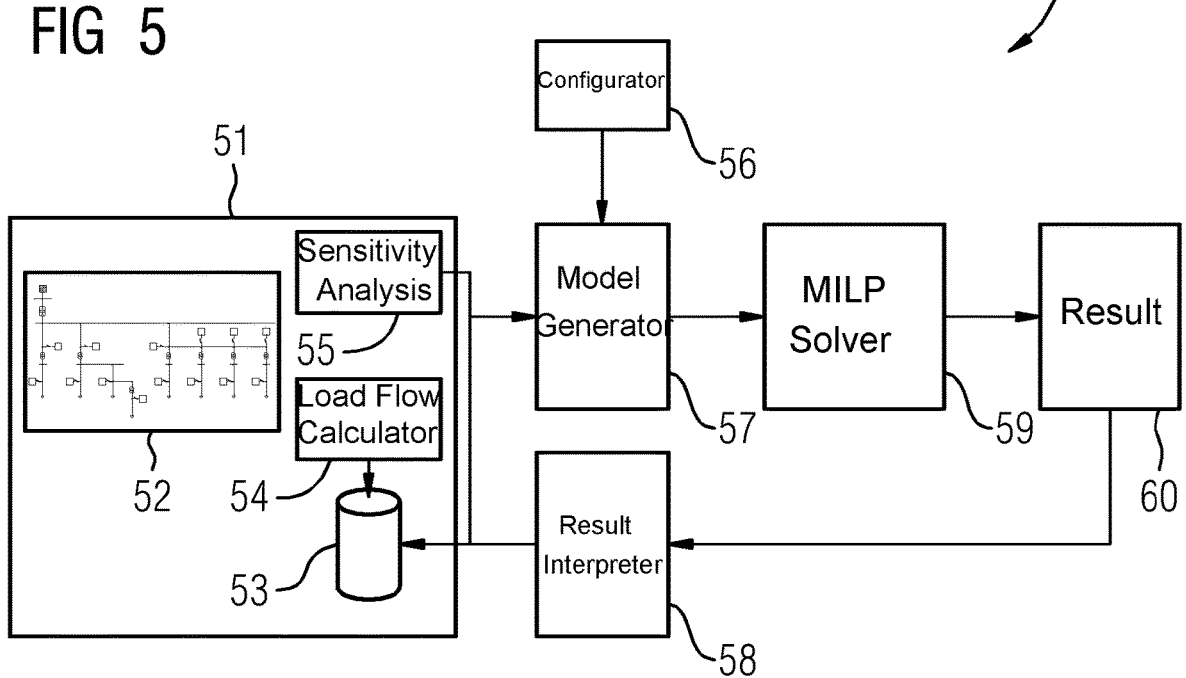
FIG. 5 is a block diagram showing a data processing arrangement for carrying out the method according to the invention.

FIG. 5 illustrates the practical working process. A data processing arrangement 50 is used in this case. In this exemplary embodiment, the data processing arrangement 50 has a network calculation program 51, a configurator 56, a model generator 57, a so-called mixed-integer linear problem solver (MILP solver) 59 as the calculation component and a result interpreter 58.

A network calculation program 51 is used to set up a network model 52 and to initially calculate a load flow 54. A sensitivity analysis 55 is also carried out. The system of equations is then produced from a network database 53 with the aid of a model generator and is written to an ASCII file. The system of equations established in this manner is passed to the model generator 57.

If necessary, the optimization problem can be adapted by a user in the model generator 57 using a configurator 56: secondary conditions can be changed, for example.

The model is passed from the model generator 57 to the MILP solver 59 which calculates the simulation and minimizes the target function. The result 60 is provided.

After a successful solution, the result file which is again in ASCII form is interpreted by the result interpreter 58 and the corresponding entries in the network database 53 are updated.

The result of the simulation is described below.

Two operating situations are now considered for the exemplary network according to FIG. 1:
a) Situation of a heavy load: all decentralized supplies are set to 0. Only the loads are taken into account.
b) Intense supply: all loads are set to 0. The supplies provide their maximum active power with a power factor of cos φ=1.
c) The voltage of the substation node 2 is controlled locally (static voltage control). For this purpose, the desired value of the voltage is set to a fixed value, here to 102% of the nominal voltage.

Figure 6:
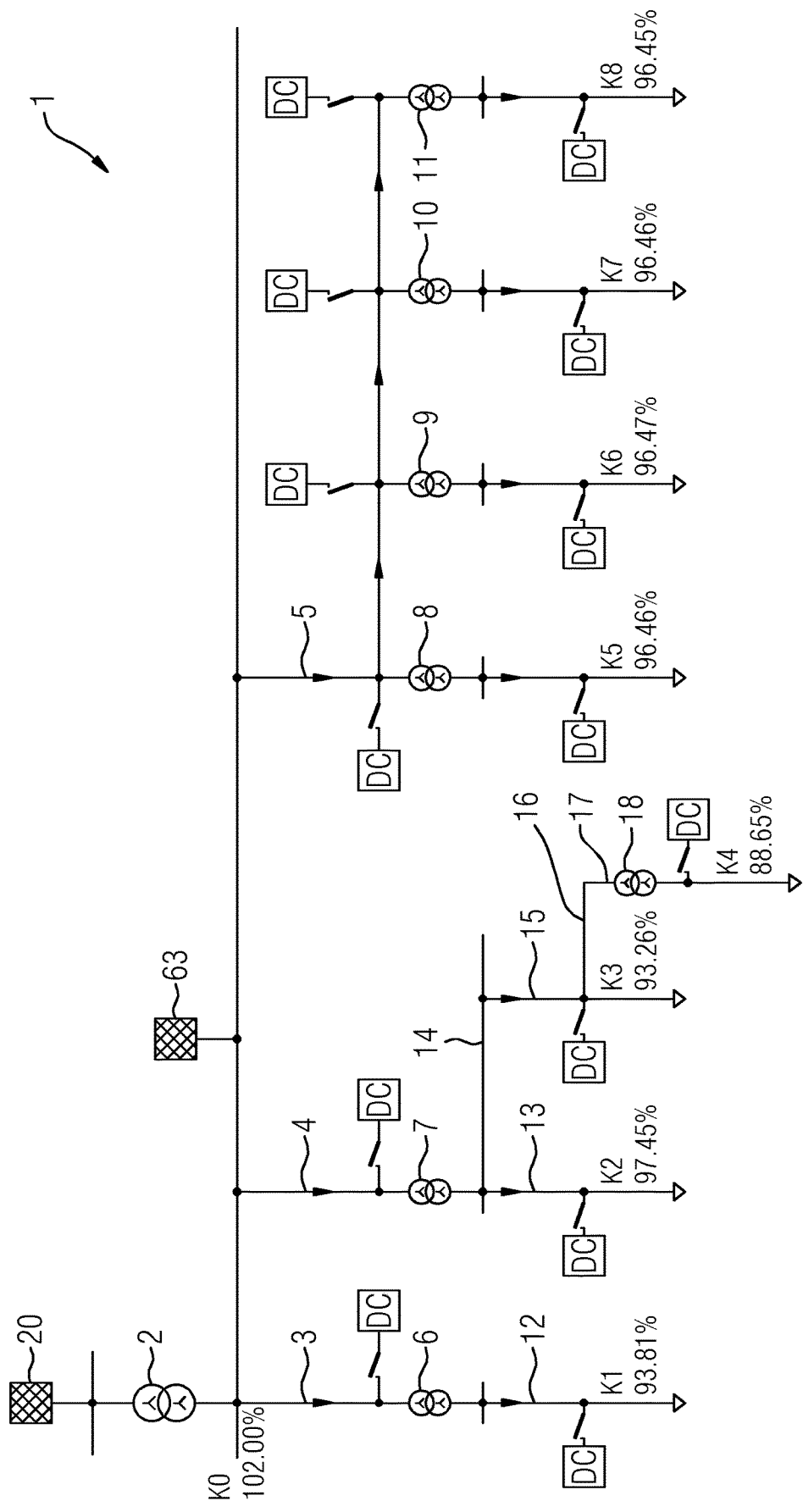
FIG. 6 is a schematic illustration showing the exemplary energy network according to FIG. 1 for a situation of a heavy load.

The node voltages in FIG. 6, which are each stated as a percentage of the nominal voltage for the low-voltage nodes K1 to K8, therefore result with a load flow calculation in the case of a neutral position of all controllers. In contrast to FIG. 1, a voltage supply 63 is also added here and impresses a voltage of 102% of the nominal voltage at the medium-voltage level on the exemplary network from FIG. 1. This is a simple approach for predefining a fixed voltage on the output side of the transformer 2 for the model.

It is seen from the load flow results in FIG. 6 that an excessively low voltage is established at the node K4 in the case of a maximum consumer load (88.65% violates the voltage band of 90% to 110%).

Figure 7:
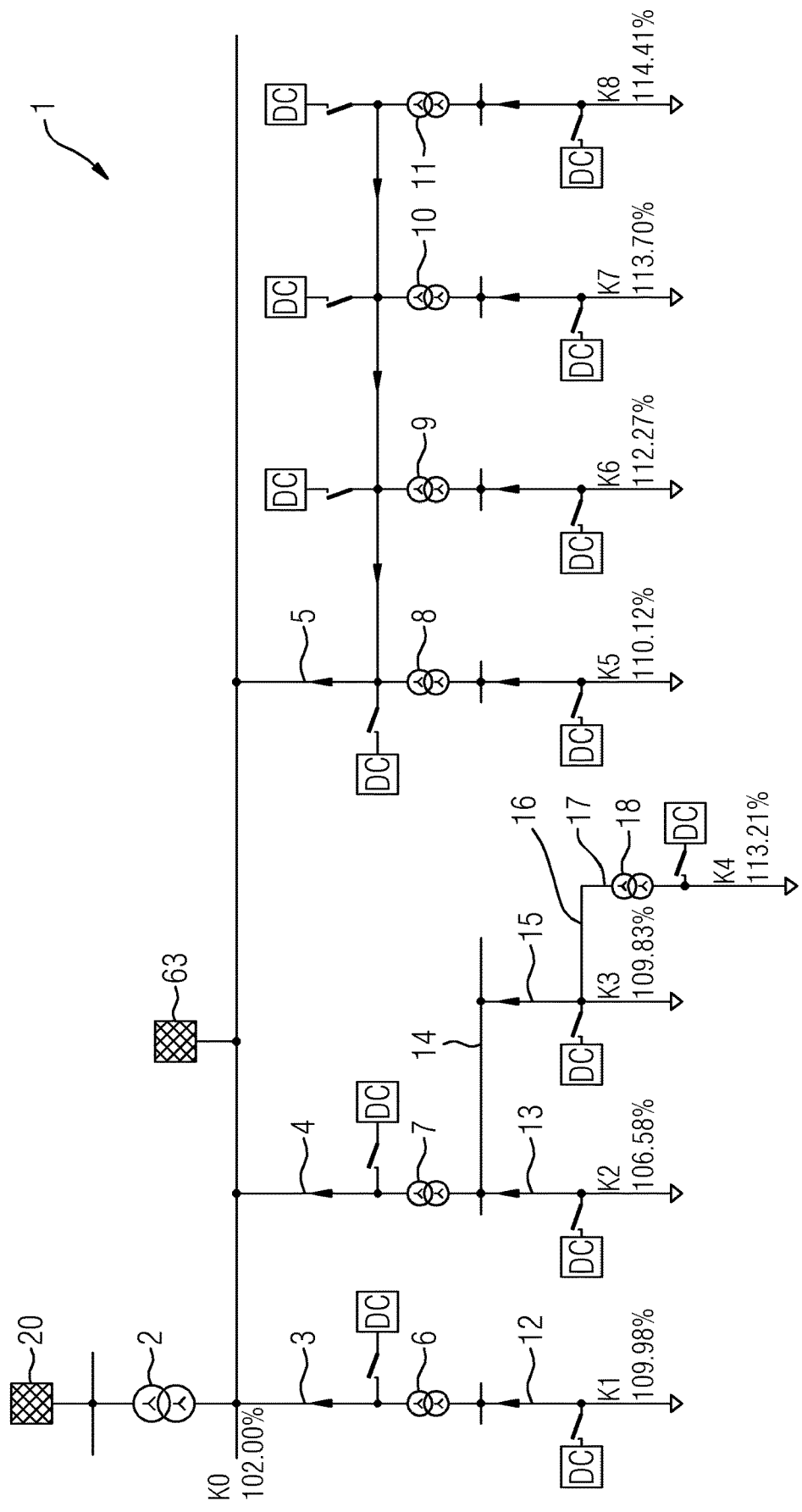
FIG. 7 is a schematic illustration showing the exemplary energy network according to FIG. 1 for a situation with intense supply.

Conversely, an excessively high voltage results at the nodes K4, K5, K6, K7 and K8 in the case of intense supply in FIG. 7. It can already be derived from this that at least the tap positions in the local network stations need to be adapted in order to be able to cover both load situations.

The following situation shall now be initially investigated: the voltage band is predefined at +/−10%. The tap positions of the conventional transformers which are required for this purpose are intended to be determined. The desired value of the voltage controller in the substation is set to 102% in the sense of static voltage control.

The optimization results are represented in Table 1.

| Node | Node voltage [%] Maximum load | Stage | Node voltage [%] Maximum supply | Stage |
|---|---|---|---|---|
| 1 | 93.81 | 0 | 102.98 | 0 |
| 2 | 97.45 | 0 | 106.58 | 0 |
| 3 | 93.26 | * | 109.83 | * |
| 4 | 90.65 | −2 | 109.21 | 4 |
| 5 | 93.96 | 1 | 107.62 | 1 |
| 6 | 93.97 | 1 | 109.77 | 1 |
| 7 | 91.46 | 2 | 108.70 | 2 |
| 8 | 91.45 | 2 | 109.41 | 2 |

The format of the table shall first of all be explained. Required changes in the tap position (*: node 3 does not have a controllable device connected immediately upstream, but is influenced by the controllable device of the node 2) result for each of the nodes 1 to 8, in which case a different tap position is respectively required for the situation of a heavy load and the situation of intense supply in the node 4. This means that dynamic control must be carried out there, which is an indication of the installation of a control device. In this case, all local network station transformers are considered to have an identical design in the example and have 5 stages from −5% to +5%.

The following knowledge can now be derived from the result according to table 1: the control positions of the transformers 5-8 need to be adapted. A controllable local network transformer does not need to be installed. Instead, the more favorable network controller can be installed in the region of the node 4 instead of a controllable local network transformer since the region of the line 17 is the low-voltage level—it suffices to adapt the voltage by a few percent using a network controller. The resulting total costs are € 16,000 if the most favorable suitable device is installed.

Figure 8:
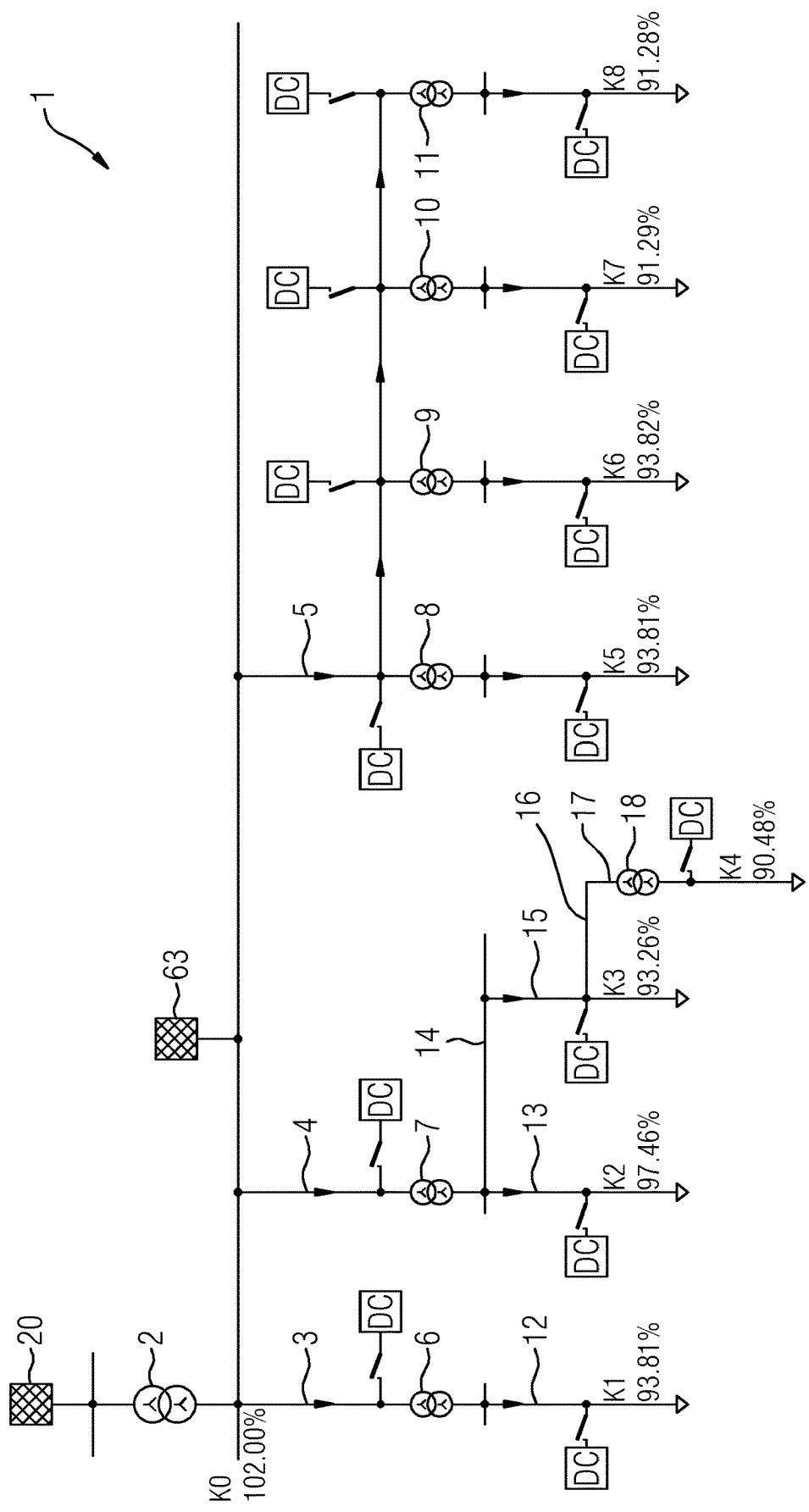
FIG. 8 is a schematic illustration showing an exemplary energy network retrofitted on the basis of a first simulation result in the situation of a heavy load.
Figure 9:
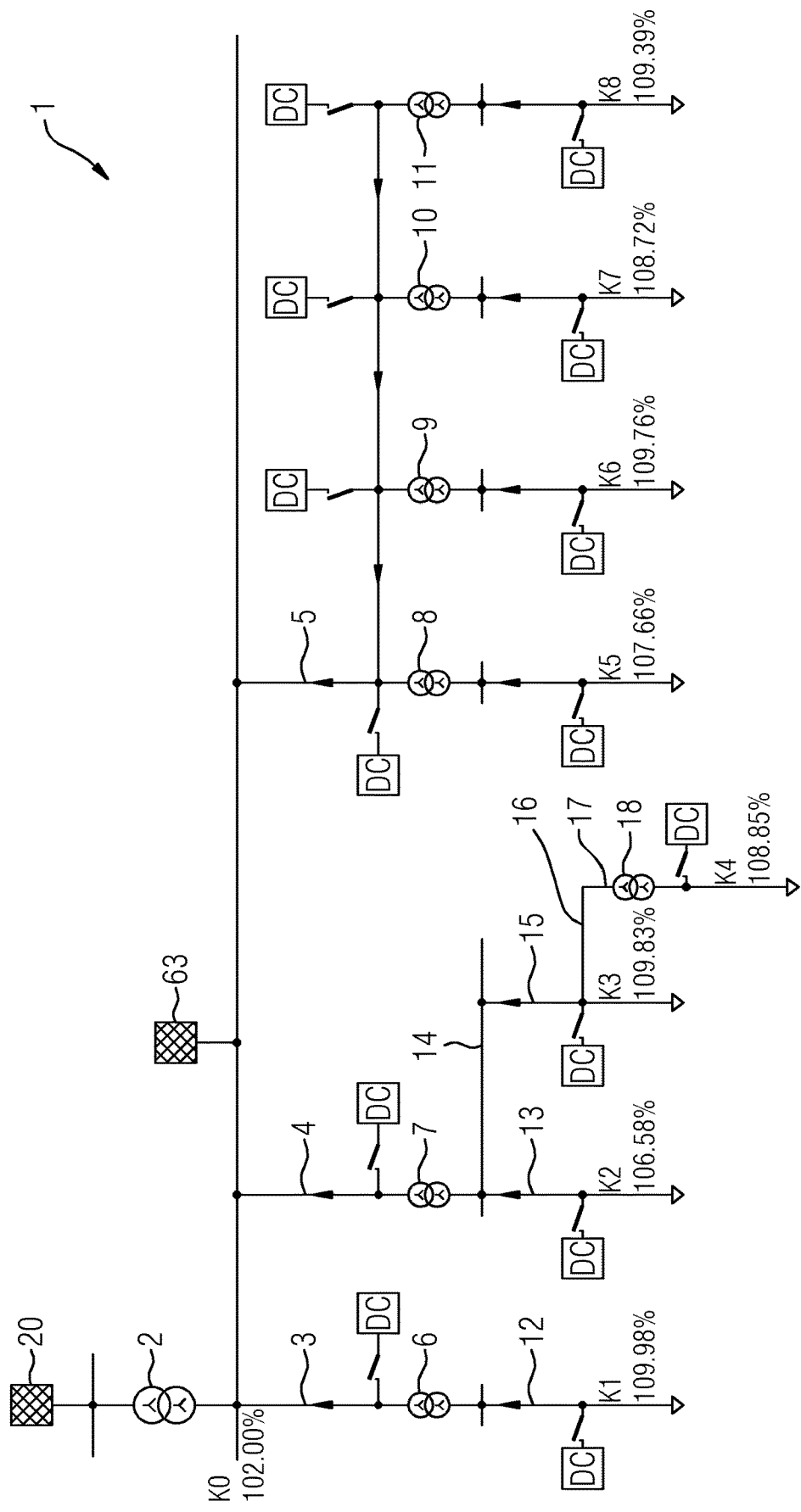
FIG. 9 is a schematic illustration showing an exemplary energy network retrofitted on the basis of the first simulation result in the situation of intense supply.

The simulation result can be confirmed by load flow calculations, the solutions of which are illustrated in FIGS. 8 (heavy load) and 9 (intense supply) for the nodes 1 to 8.

A narrower voltage band of +/−5% is now intended to be predefined in the region of the node 2. In this case, the question immediately arises of whether replacement of the network station with a controllable local network transformer is not the more favorable solution in this situation. The simulation result for this situation is shown in Table 2.

| Node | Node voltage [%] Maximum load | Stage | Node voltage [%] Maximum supply | Stage |
|---|---|---|---|---|
| 1 | 93.81 | 0 | 109.98 | 0 |
| 2 | 104.45 | −7 | 99.58 | 7 |
| 3 | 100.26 | * | 102.83 | 0 |
| 4 | 95.65 | 0 | 106.21 | 0 |
| 5 | 93.96 | 0 | 107.62 | 0 |
| 6 | 93.97 | 0 | 109.77 | 0 |
| 7 | 91.46 | 0 | 108.70 | 0 |
| 8 | 91.45 | 0 | 109.41 | 0 |

It is seen from the result that a controllable local network transformer must now be actually used instead of a network controller in order to comply with the more stringent conditions. This increases the target function value.

Figure 10:
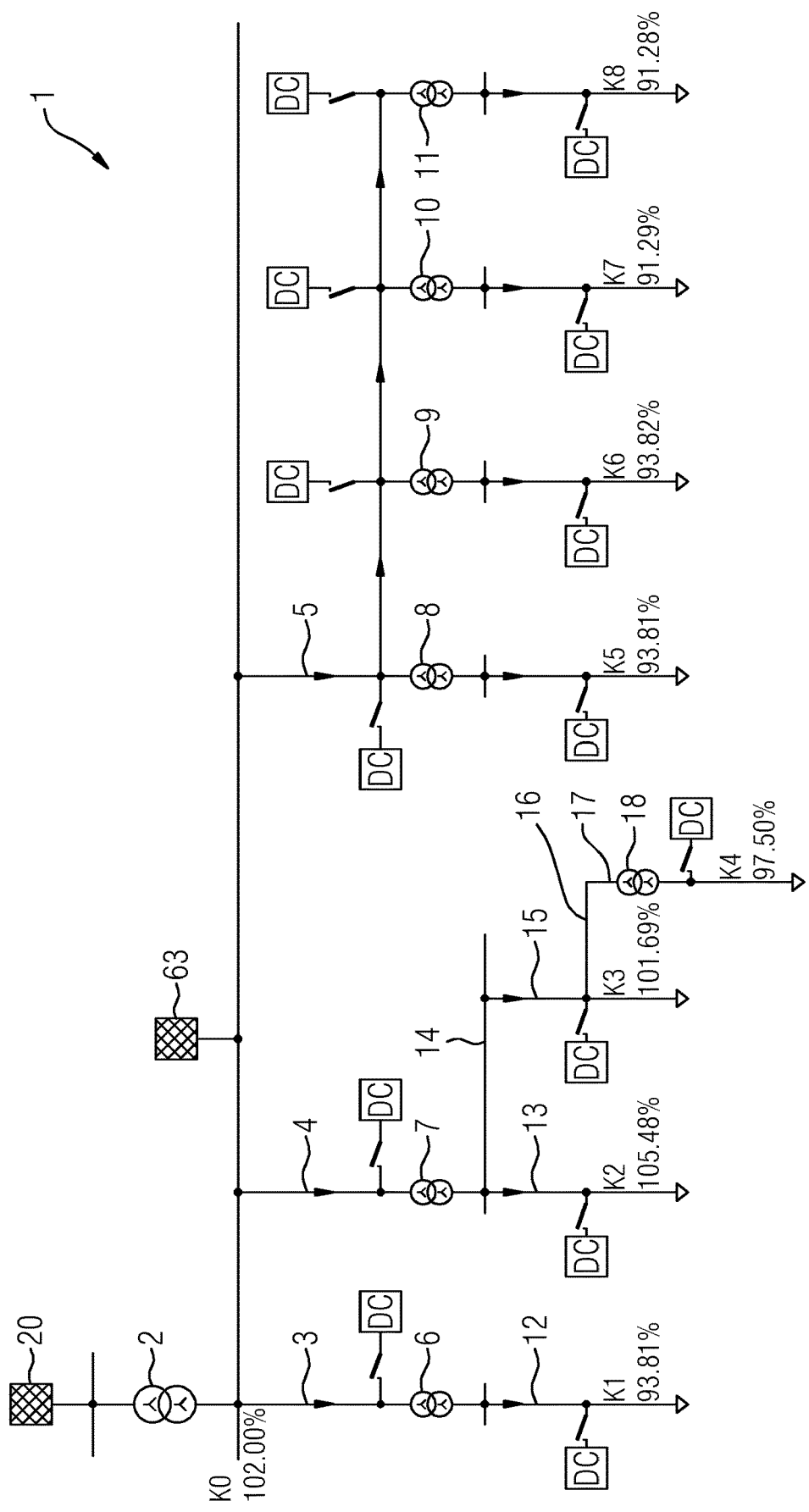
FIG. 10 is a schematic illustration showing an exemplary energy network retrofitted on the basis of a second simulation result in the situation of a heavy load.
Figure 11:
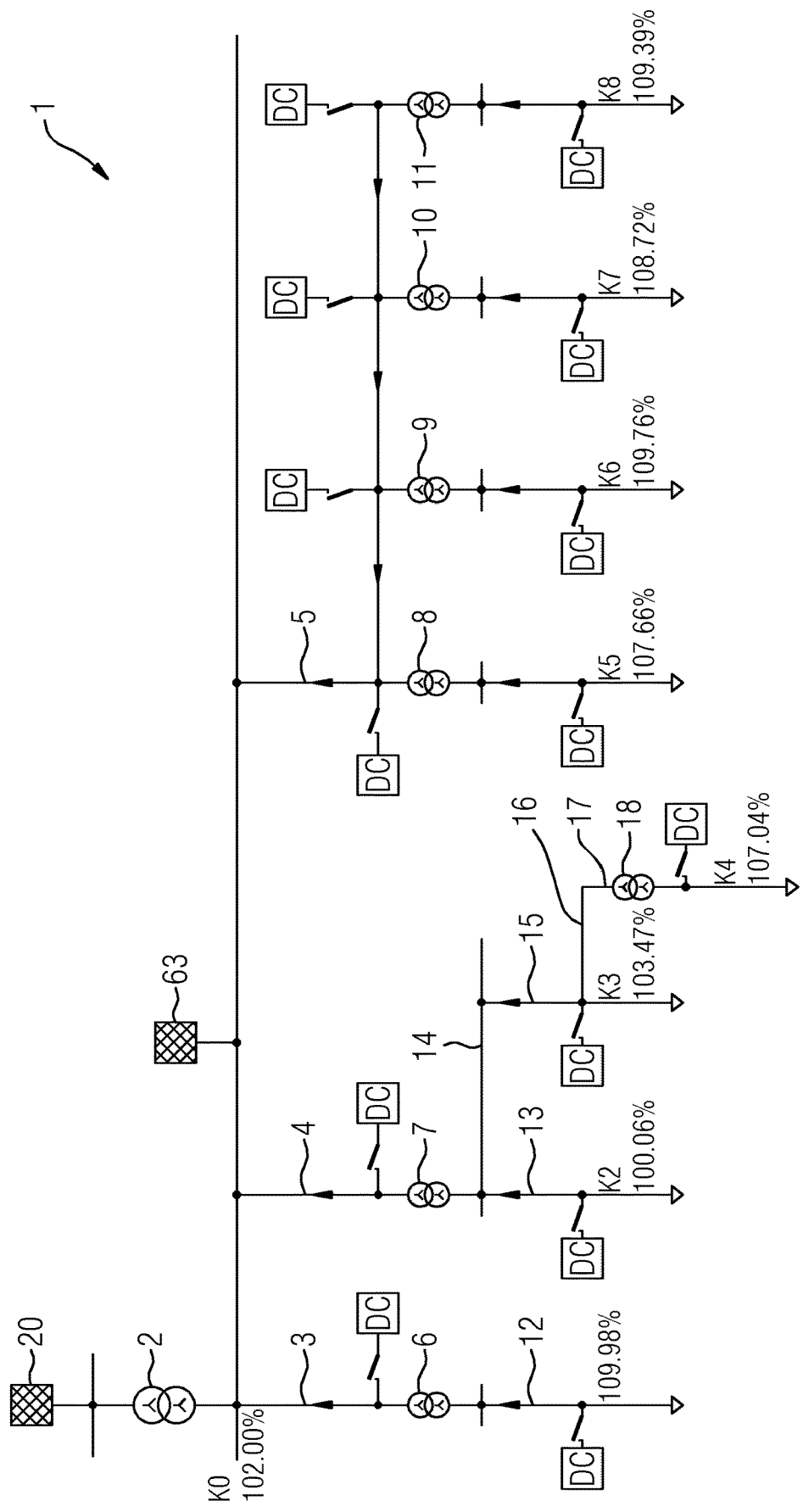
FIG. 11 is a schematic illustration showing an exemplary energy network retrofitted on the basis of a second simulation result in the situation of intense supply.

The verification of the optimization result with the aid of load flow calculations is illustrated in FIGS. 10 (heavy load) and 11 (intense supply). The linearization errors are somewhat greater in the region of the node 2 than in the other regions. However, this does not influence the final decision that a controllable local network transformer must be provided.

This simple example explains a preferred variant of the method according to the invention.

In one development, instead of the dynamic voltage control with a constant voltage being predefined, dynamic control operations such as compound control or even wide-range voltage control operations can also be designed by simply modifying the secondary conditions. However, it should already be noted at this point that, in the case of dynamic voltage control, in particular in the substation, it can no longer be guaranteed that the mastery of the extreme situations also simultaneously means that intermediate operating situations can be mastered. In this case, it is necessary to determine and accordingly observe the critical network nodes.

In summary, it can be stated that the method according to the invention makes it possible to determine the required voltage control settings and control devices by taking into account the most economical use of capital. Those local network stations which must be replaced with controllable local network transformers are determined for this purpose. The corresponding capital costs are taken into account. In this case, the decision may also be in favor of a network controller if the voltage limits of the network nodes in the respective subnetwork are already complied with thereby. The minimum number of new control devices required is also achieved by setting optimal tap positions of the conventional local network stations in the sense that as little additional control range as possible is required. This is the basis for optimally setting the voltage controller in the substation. The method described can be used during network structure planning and is therefore initially an offline method.

In a first development of the exemplary embodiment, linearization errors can be reduced.

The accuracy of the method depends on the volatility of the node voltages. If the node voltages change only in a limited range as a result of the control position, the deviations of the linear calculation from the accurate non-linear complex calculation can be disregarded. In the case of large voltage differences between the starting value and the solution value, systematic deviations occur on account of the voltage dependence of the node currents, which deviations are significant but can still be handled. Therefore, a correction term with the aim of reducing the linearization error is already introduced in equation 8.

The first sum in equation 8, the linearization term, describes the voltage differences caused by the non-linearity with respect to the value $u_i$. With a uniform constant power character, the linearization term must be analyzed more closely. In this case, it can in turn be broken down into a sum containing the differential coupling resistances and containing a term with the differential inherent resistance.

In a first approach, the coupling elements to other network nodes are initially intended to be disregarded. The following simplification according to equations 39 and 40 then results.

In this case, the absolute value of the complex apparent power can be used instead of the active power. This approach is now intended to be reproduced for the load situation according to table 3 which results without using the linearization term (*denotes the voltage at the medium-voltage level K0).

TABLE 3

| Node | Node voltage [%] Maximum load | Stage | Node voltage [%] Maximum supply | Stage |
|---|---|---|---|---|
| 0* | 91.82 | | 107.61 | |
| 1 | 98.97 | 0 | 100.09 | 0 |
| 2 | 102.83 | 0 | 96.58 | 0 |
| 3 | 98.35 | 0 | 99.93 | 0 |
| 4 | 100.00 | 0 | 100.00 | 0 |
| 5 | 101.77 | 0 | 100.22 | 0 |
| 6 | 99.27 | 0 | 99.95 | 0 |
| 7 | 99.26 | 0 | 101.42 | 0 |
| 8 | 99.25 | 0 | 102.15 | 0 |

The load flow equations are intended to be modeled in a first step according to equation 39. The elements of the linearization term according to table 4 result in this respect.

TABLE 4

| Node | $u_0$ [%] | s [MVA] | Z [Ω] | u0 [kV] | r [Ω] | g [S] | r * g | r * g * $u_0$ [%] |
|---|---|---|---|---|---|---|---|---|
| 0* | 97.61 | 20.904 | 1.645 | 19.522 | 1.645 | −0.055 | −0.09 | −8.807 |
| 1 | 88.97 | 0.13 | 0.096 | 0.356 | 0.096 | −1.264 | −0.098 | −8.77 |
| 2 | 92.83 | 0.065 | 0.096 | 0.371 | 0.096 | −0.471 | 0.045 | −4.201 |
| 3 | 88.35 | 0.065 | 0.096 | 0.354 | 0.096 | −0.520 | −0.049 | −4.414 |
| 5 | 91.77 | 0.091 | 0.096 | 0.367 | 0.096 | −0.675 | −0.065 | −5.95 |
| 6 | 91.77 | 0.091 | 0.097 | 0.367 | 0.097 | −0.675 | −0.066 | −6.011 |
| 7 | 91.76 | 0.091 | 0.097 | 0.367 | 0.097 | −0.675 | −0.066 | −6.012 |
| 8 | 91.75 | 0.091 | 0.098 | 0.367 | 0.097 | −0.676 | −0.066 | −6.075 |

Figure 12:
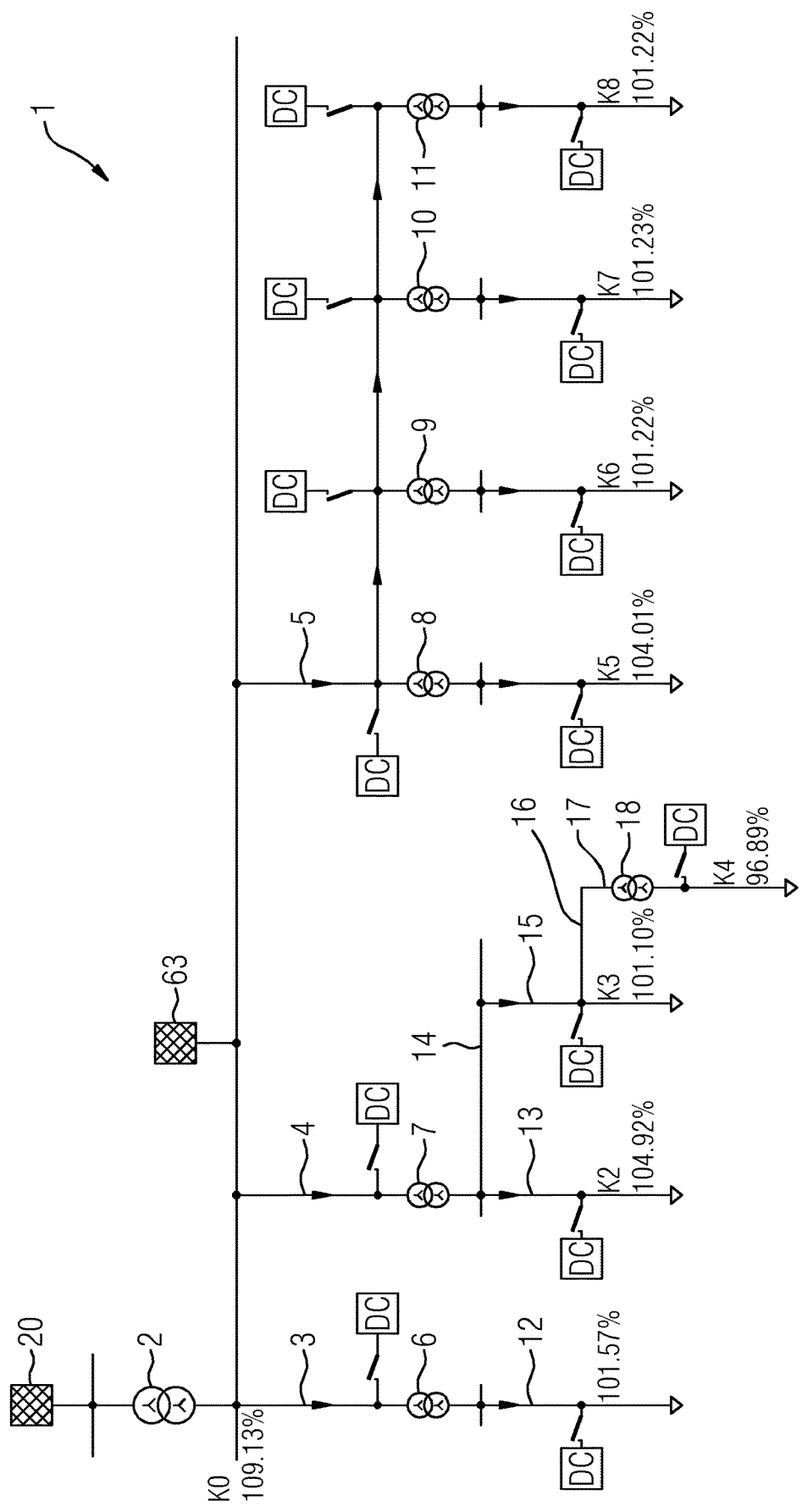
FIG. 12 is a schematic illustration showing the exemplary network according to FIG. 1 with an increased medium voltage at the node K0.

The voltage equations are now expanded with these values for the linearization term. In this case, the control positions are now taken from the uncorrected calculation from FIG. 12. In this example, there was only one network controller in the network: the network controller which controls the node K04. Assuming that the network controller can adjust the voltage, the node voltage is known (100%) and can therefore be disregarded in the consideration. Therefore, the numerical deviations were then considered only for the remaining nodes.

The correction is carried out for the situation of a heavy load (a). The results of the corrected calculation are represented in table 5. It is seen that all node voltages have now moved in the direction of a higher voltage.

TABLE 5

| Node | Node voltage [%] Maximum load | Stage | Node voltage [%] Maximum supply | Stage |
|---|---|---|---|---|
| 0* | 91.82 | | 108.64 | |
| 1 | 99.95 | 0 | 100.09 | 0 |
| 2 | 104.34 | 0 | 96.58 | 0 |
| 3 | 99.79 | 0 | 99.93 | 0 |

TABLE 5-continued

| Node | Node voltage [%] Maximum load | Stage | Node voltage [%] Maximum supply | Stage |
|---|---|---|---|---|
| 4 | 100.00 | 0 | 100.00 | 0 |
| 5 | 103.51 | 0 | 100.22 | 0 |
| 6 | 100.64 | 0 | 99.95 | 0 |
| 7 | 100.63 | 0 | 101.52 | 0 |
| 8 | 100.69 | 0 | 102.15 | 0 |

Figure 13:
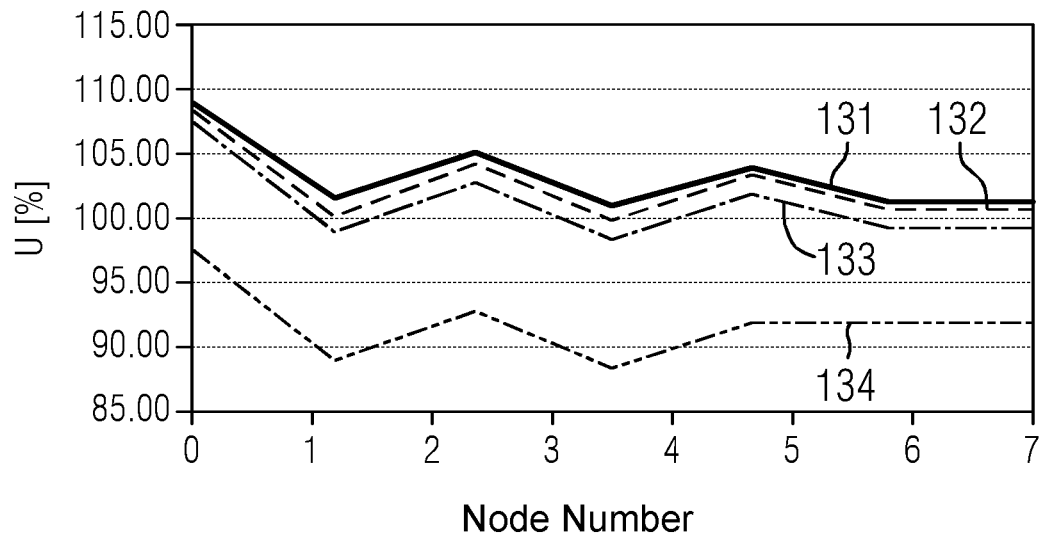
FIG. 13 is a graph showing node voltages taking into account correction terms for linearization errors.

The corrected voltage values have now significantly approached the actual voltage values, as shown in FIG. 13. On the basis of the initial calculation values 134 for the node voltages, the node voltages with a correction term for the linearization 132 and without a correction term 133 result, the mathematically exact solution 131 likewise being illustrated. Another improvement is also possible if the coupling resistances $r_{i,j}$ are modeled. This will result in a more positive effect, the stronger the coupling or the shorter the electrical distance between the nodes. In the present example, the coupling is mainly effected via the medium-voltage network, with the result that the individual coupling resistances are very small on account of the transformer impedances of the local network stations. However, these occur as a sum in the voltage equation of each individual node voltage and can therefore have a significant influence. If, in addition to the inherent coupling, the coupling to other network nodes is also considered, the calculation result can be improved again. However, it must be borne in mind that the sparseness of the voltage equation matrix is relinquished if all possible couplings are taken into account: this has a considerable influence on the calculation speed of the solver. With a typical radial structure of a network, consumers of different medium-voltage lines are coupled via the impedance of the substation transformer. However, these couplings are already implicitly taken into account via the inherent term of the substation node. Only the coupling terms to the network nodes in the same medium-voltage or low-voltage line therefore need to be taken into account and the sparseness of the voltage matrix is retained as far as possible.

In a second development of the exemplary embodiment, the method can be adapted in order to also state the required type of controllable device in addition to the position as the result.

In order to be able to state a type from a particular manufacturer as the controllable local network transformer to be retrofitted in the abovementioned examples of the simulation, the tap position and the additional voltage/stage can be formulated as secondary conditions. In this case, the values according to equations 41 to 45 result for the Siemens FITformer, the values according to equations 46 to 50 result for the MR GridCon iTap from MR Reinhausen, the values according to equations 51 to 55 result for the Magtech magnetically controllable local network transformer in the transformer variant and the values according to equations 56 to 58 result in the network controller variant, for example. The values according to equations 59-61 result for the network controller from Walcher.

These values can be used to expand the model according to equations 62-64. In this case, the control term is subdivided into a conventional part and into a controllable local network transformer part (double sum), in which case the index s runs across the different options. This means that all optional controllable local network transformer possibilities at a location are, in principle, taken into account at the same time. However, as a result of the target function, only one variant and then only the most cost-effective variant is selected, if at all.

The optimization is based on the same network model as explained at the outset. In the calculation there, the use of a network controller for the maximum voltage band initially generally proved to be the most favorable solution. It is now investigated which controller is intended to be used here. It emerges that the network controller which has to be used must operate in both directions (tap position −1 and 1). The Magtech controller does not provide this and therefore cannot be used at this location.

In a similar manner to the procedure at that time, the voltage band is now intended to be narrower at least in the region of the node 2. A controllable local network transformer must be used in this situation. This is the GridCon iTap controller in this situation. The network controller in the outgoing circuit to K4 can then be dispensed with, with the result that only the investments for the controllable local network transformer arise. The solutions are permissible for this example (details not shown), but there are significant deviations between the linear load flow calculation and the iterative load flow calculation in the region of the node 2. However, this could be improved with appropriate correction with the aid of the linearization term.

The case of what a solution with a FITformer from Siemens would have looked like is now intended to be considered. The resulting target function is now composed of the costs of a FITformer and the costs of a Magtech network controller: since the control range of the FITformer does not suffice to compensate for the voltage drop for the node 4, a network controller which must compensate for further voltage drops is additionally required. Since the Magtech controller can be adjusted in an infinitely variable manner, the voltage conditions are also accurately adjusted on account of the integer condition being omitted. In this case too, it must be emphasized that, although the extreme situations can be mastered with the aid of the dynamic voltage control, it is not ensured that all intermediate situations can likewise be mastered. Corresponding node voltages must be monitored here in the case of a heterogeneous consumption and production structure.

In a third development of the exemplary embodiment, the method can be adapted in order to achieve improved tolerance for large supplies even in the case of a network which is otherwise unchanged (no additional controllable devices).

The EEG supply management is understood as meaning a network safety measure for renewable energy, mine gas and nuclear power plant installations. Their preferential supply can be temporarily reduced if the network capacities available for transporting electricity are not sufficient. In this case, compensation payments corresponding to the installation operators affected by the supply management need to be made. These compensation payments are covered by the network charges. In this case, there may be two reasons for initiating supply management:
1. Overloading of equipment
2. Violation of the voltage bands predefined by standards.

In the first situation, the supply management measures are obvious: the producer power in the corresponding network branch, for example, should be reduced such that the overloading is eliminated. However, depending on the network configuration, the voltage control concept for the distribution network may be configured in such a manner that greater leeway toward higher voltages is obtained with regard to the node voltage but without disregarding the requirements imposed on the situation of a heavy load. Such a control concept includes the dynamic voltage control in the substation and the stationary tap changer positions in the local network stations. The proposed method is explained using the exemplary network.

In contrast to the previously described approach, the method is now used to design a control concept with a minimum amount of effort, that is to say without using controllable local network transformers or network controllers. This control concept manages with the following measures:
1. Determination of a consistent desired value in the substation in the sense of static voltage control.
2. Determination of the stationary tap positions of the local network stations.

In order to implement this control concept, the previous method is modified as follows:
a) The desired voltage value in the substation is released for optimization, but must have the same value for both extreme situations (maximum load or maximum supply). The final desired value can then be obtained from the starting value during initial calculation and the resulting control position of the substation controller.
b) The target function is expanded with penalty terms for controlling the control operations.

There is usually more than one solution to the optimization problem. The solutions will have different control positions without violating the secondary conditions or impairing the target function. This leeway can now be used to force the resulting voltage values of the network nodes in a particular direction. If there is a desire to operate the network with losses which are as low as possible, a higher voltage level is generally desirable. However, if the intention is to obtain greater leeway in the voltage reserve in the situation of intense production, the general voltage level should be oriented to the lower voltage limits. Control is effected by the penalty terms in the target function, in which case a deviation of a node voltage from a desired voltage level is assessed using a penalty term (equation 65). The penalty terms are determined for all node voltages as follows (equation 66).

The penalty terms should be selected in such a manner that the remaining cost factors remain dominant. The investment cost terms may be retained: it is precisely the aim of changing a control setting in such a manner that no additional control devices are required.

In contrast to the previous procedure, a change was made in the example used: the secondary conditions for the node K4 are not taken into account here because otherwise the leeway would become too restricted and the desired effect would not become so clear. However, this disregard is not an actual restriction: it can be considered to be equivalent to a network controller in K4 which also proved to be the most favorable solution at the outset.

Table 6 now represents the control positions of the remaining control devices.

| $U_{soll}$ [%] | T0 | T1 | T2 | T5 | T6 | T7 | T8 |
|---|---|---|---|---|---|---|---|
| 90 | 4 | −2 | −2 | −1 | −1 | −1 | −1 |
| 105 | 0 | 0 | 0 | 1 | 1 | 2 | 2 |

Figure 14:
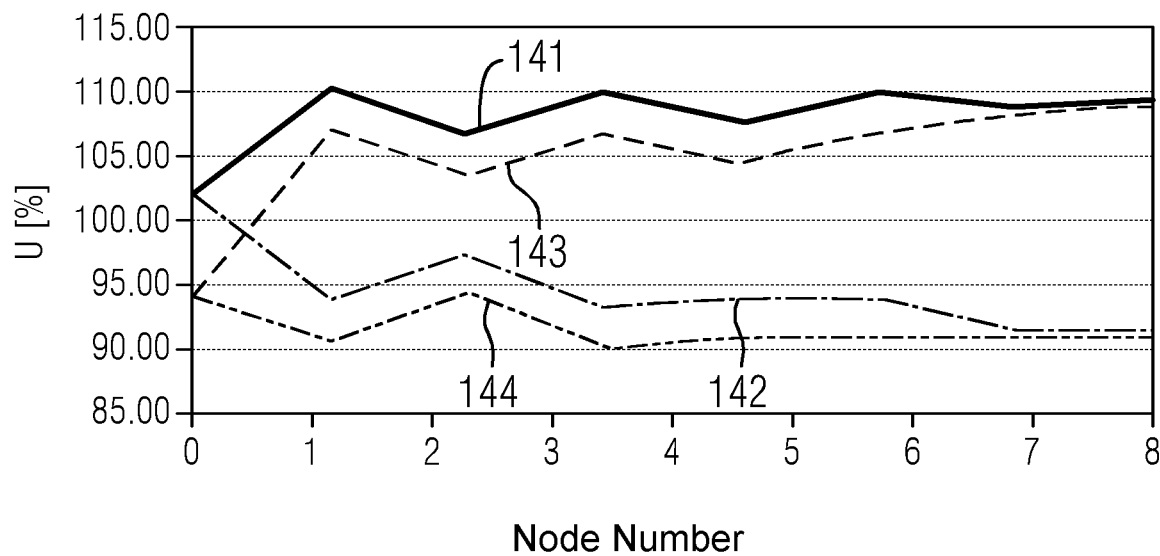
FIG. 14 is a graph showing node voltages with optimized supply management.

Clear differences are now seen here in the interaction between the desired value in the substation (node K0) and the tap positions in the individual local network stations. As shown in FIG. 14, the desired value is set to 94%=102%−4*2% in the optimized situation, while it is set to 102% in the normal situation. This corresponds to the setting values in the table. The operating situations of the normal or typical production situation 141, the normal or typical load situation 142, the production situation 141 optimized as the result of the developed method and the load situation 143 optimized as the result of the developed method are illustrated. It is seen that the operating voltage now evolves in the direction of lower voltage in both extreme situations 141, 143, but without falling below the permissible lower cut-off voltage of 90%. In this case, the penalty terms are now based on the lower limit of 90%. The difference is significant but nevertheless is not too large: the network itself already has such extreme load and production situations that the leeway is restricted.

Therefore, greater leeway, which can also be used in more narrowly predefined voltage bands, results in the case of better conditioned networks. This method can now also be used to assess whether the desired value selected in practice in the substation is still suitable even under the changed network conditions or whether there is potential for preventive adaptation. This step should be carried out first before expanded strategies of close-range control and wide-range control are taken. The described method for determining the stationary tap positions of local network stations opens up additional leeway in supply management. Under the aspect of voltage quality, more decentralized feeders can hereby be connected without expecting increased intervention by the supply management. Furthermore, optimization potentials can therefore be exhausted before the voltage control concept has to be implemented by alternative close-range control (compound control) or wide-range control methods. In a fourth development of the exemplary embodiment, the method can be adapted in order to enable wide-range voltage control.

The conventional voltage control in the medium-voltage network is carried out with the aid of the voltage controller on the high-voltage side of the substation transformer in the substation. In the simplest case, the desired value of the busbar directly connected to the secondary side is controlled in this case to a fixed value. In this case, the desired value can be changed, but the change is generally made "manually". In this method, it is assumed that the highest voltage occurs on the busbar in the substation and the voltages of the subordinate medium-voltage or low-voltage nodes are therefore lower based on the respective nominal voltage. The different control strategies for the voltage in the substation shall be described first of all. The stationary specification of the desired value is based on the following heuristics: the secondary voltage changes on the basis of the flow of reactive power via the transformer. The voltage difference across the transformer is adjusted to a stationary desired value via the control. The voltage difference in the distribution network is adjusted by means of the level of the desired value (for example 104% instead of 100%). In the past, this method provided good services in the case of a resistive-inductive load character. In contrast, it reaches its limits in the case of a bidirectional load flow.

In order to counter the problem of bidirectional load flow, the desired voltage value can be dynamically derived from the power flow via the transformer. This strategy of so-called compound control has also been used in the past in the individual situation in consumer networks in order to also reduce the voltage difference in the network in addition to the voltage drop across the transformer. For this purpose, an offset was calculated from the absolute value of the transmitted power in the situation of a heavy load, by which offset the desired value can be increased. In order to take into account the voltage increase, this method has been expanded to the effect that the active power direction is now also processed as an indication of intense supply. In the case of return supply, the node voltages in the line stations are then reduced by dynamically reducing the desired value. This method is used at E.ON Bayern, for example. There, this method is given preference over wide-range control for reasons of costs since the amount of communication effort has been identified as the greatest disadvantage in the latter. In contrast, so-called close-range control is understood as meaning the control of a locally measurable voltage and therefore also the measurement of the voltage in the substation. The desired value of the local busbar voltage can be predefined in this case independently of the operating situation of the network or from a local variable which changes with the operating situation.

These two concepts of close-range control and compound control can be developed further within the scope of wide-range control.

The assumption on which compound control is based reaches its limits, however, if the network area to be supplied has a heterogeneous end customer character: network areas having a strong consumer character (for example industrial area) and a supply character may definitely occur in a medium-voltage area. Depending on the level of the return supply, compound control may result in a reduction in the voltage in the substation, which can then have a counterproductive influence on the network voltages in medium-voltage lines dominated by consumers. Furthermore, compound control may at best tend to cause counteraction and the violation of the voltage conditions according to the standard EN 50160 cannot be reliably excluded in this case.

The strategy of wide-range control begins precisely at this point. At the latest in this situation, the calculation of the desired value must include a larger network region in the consideration. Wide-range voltage control is referred to in this situation.

This wide-range voltage control is expected to be able to make the greatest contribution to avoiding network expansion measures. However, there are also criticisms of this: in particular, the process of ensuring that the measuring points are assigned to the central voltage controllers is cited as a week point since this can change on account of switching actions in the medium-voltage network. Furthermore, the problem of selecting the measuring points is cited. For example, the voltage bands have hitherto been monitored in chosen network nodes with the aid of measurements and the desired value of the substation transformer has hitherto been changed until the limits are complied with. The measuring points are selected during field measurements. Further steps such as reactive power control or supply management must be carried out only when the voltage control activities in the substation reach their limits.

The methods of compound control and wide-range control belong to the group of dynamic voltage control operations since the tap changer position can change here on the basis of the network state. This now means that the tap position in the substation is changed depending on the load situation instead of the stationary voltage control.

All decision variables are now released in the model and the following result from the simulation:
a) possibly different control positions of the tap changer in the substation for different operating situations,
b) tap positions which are optimized but are identical for the different operating situations for the existing controllable devices in the energy network.

It shall now be assumed that no further dynamic network control devices or controllable devices are required.

All operating situations in the network can therefore be covered with the aid of the two extreme positions of the tap changer in the substation provided that the network lines have a homogeneous structure. If this is not the case, control measurements must be carried out.

The following procedure is now proposed:
1. Initial calculation (determination of the extreme load flows).
2. Determination of the optimal tap changer position in the controllable devices, for example the local network stations.
3. Setting of the now fixed tap positions from step 2.
4. Initial calculation again**.
5. Determination of the optimal tap changer positions in the substation or substation transformer.

Figure 15:
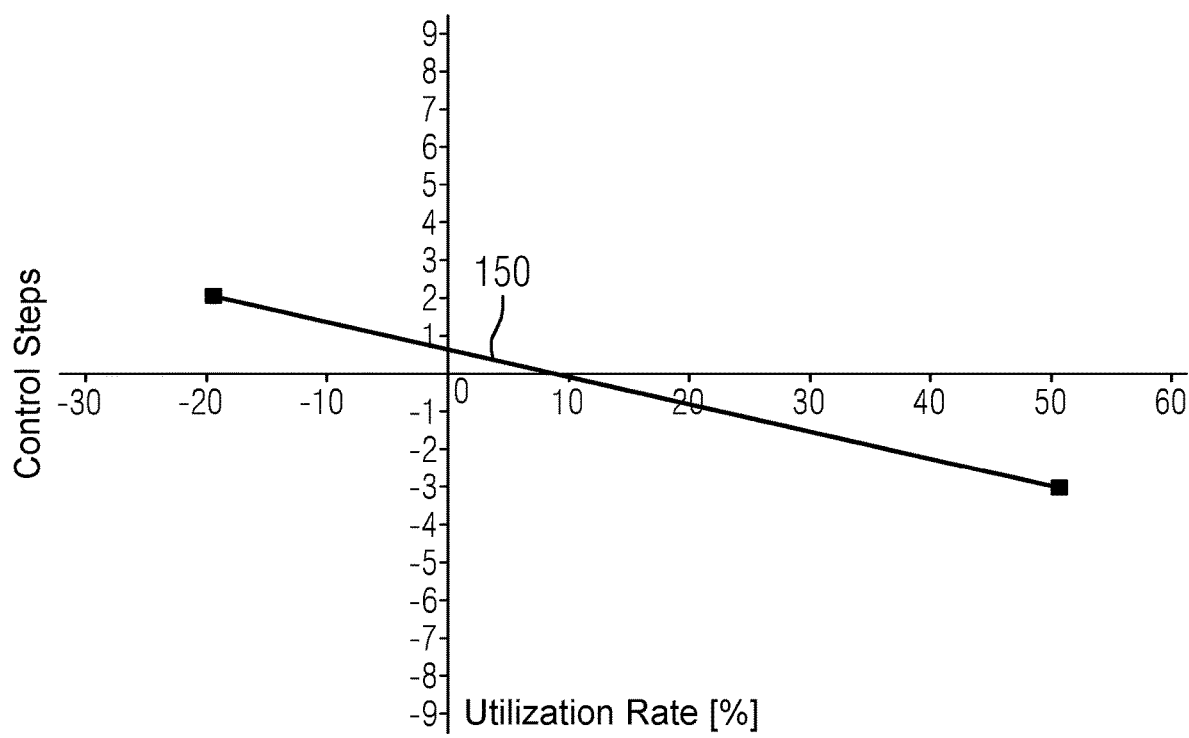
FIG. 15 is a graph showing a control characteristic curve of compound control.

Step (4) is not absolutely necessary. However, it improves the computing accuracy of the voltage calculation and the approach could also be used as part of an online control algorithm. The control characteristic curve 150 according to FIG. 15 $r_j=f(i_{Transformator})$ can now be determined from the extreme positions determined in this manner for the tap changer in the substation, the optimization determining, for example, a position value of 2 for a return supply at the level of 20% of the nominal transformer current. A control position of −3 would result in the case of a maximum load of 50% for the maximum load scenario. The simplest compound control characteristic can then be directly determined from the graph. This naturally cannot refute the argument that a limit value may nevertheless be violated by the compounding process in the case of a heterogeneous customer structure in the network. In this case, the concept of dynamic network control should be expanded to wide-range control with voltage monitoring. The strategy for wide-range voltage control results almost inevitably from the more general problem if only the control position of the voltage controller in the substation is released and, as described above, the positions of the local network stations are held at the optimized stationary value. If there is more than one solution for the operating situation considered, the solution can be controlled in the direction of a predefined voltage range with the aid of the penalization method described in the third development of the exemplary embodiment. The decision variables for the controllable local network transformers or network controllers have the task of penalizing violations of the voltage band in the case of this problem: if the voltage bands cannot be complied with solely by adjusting the tap changer in the substation, the target function is not equal to zero and supply management measures must be taken. The number of binary optimization variables required is now considerably reduced since the transformation ratios are now fixed for the local network stations and only the variables for the dynamic network control elements need to be determined.

The target function can now be formulated according to equations 65 and 66 with the aid of the decision variables obtained in this manner.

The target function now assumes the character of a penalty function: if the investment term is not equal to zero in this case (the two first sums), the control task cannot be carried out solely using the voltage controller in the substation and further measures such as reactive power control or supply management must be taken. Alternatively, the node voltage values can naturally be penalized directly upon leaving the permissible voltage band: the decision variables for the controllable local network transformers and the network controllers are then also dispensed with. This then results in the problem formulation according to equations 67-69. The weighting factors $C_i$ can be consistently selected, but should be so large that there is no interference with the voltage control term $\Sigma_i p_i$.

The accuracy of this result can be improved by correcting the linearization errors according to the first development of the exemplary embodiment.

The following four pages show all equations to which reference is made in this application.

$$|u_i^{(k)}| = |E_i(s^{(k)}, Z^{(k)})| \tag{1}$$

$$= |E_i(s^{(0)}, Z^{(0)})| + |G_i(\Delta i^{(k)}, \ddot{u}_1^{(k)}, \ldots, \ddot{u}_{in}^{(k)})| \tag{2}$$

$$= |u_i^{(0)}| + \sum_j |G_{i,j}(\Delta i^{(k)}, \ddot{u}_j^{(k)})| \tag{3}$$

$$|u_i^{(k)}| = |u_i^{(0)}| + \sum_j |G_{i,j}(i^{(k)}, \ddot{u}_j^{(k)})| \tag{4}$$

$$= |u_i^{(0)}| + \sum_j |G_{i,j}(i^{(k)}, \ddot{u}_j^{(k)})| \tag{5}$$

$$= |u_i^{(0)}| + \sum_m \Delta U_i(i_m^{(k)}) + \sum_j V_{i,j}(\ddot{u}_j^{(k)}) \tag{6}$$

$$= |u_i^{(0)}| + \sum_m \Delta U_i(i_m^{(k)}) + \sum_j v_{i,j}\ddot{u}_j^{(k)} \tag{7}$$

$$= |u_i^{(0)}| + \sum_m \frac{\delta U_i}{\delta i_m^{(k)}} \Delta i_m^{(k)} + \sum_j v_{i,j}\ddot{u}_j^{(k)} \tag{8}$$

$$\sum_m \frac{\delta U_i}{\delta i_m^{(k)}} \Delta i_m^{(k)} = \sum_{m \neq i} \frac{\delta U_i}{\delta i_m^{(k)}} \Delta i_m^{(k)} + \frac{\delta U_i}{\delta i_i^{(k)}} \Delta i_i^{(k)} \tag{9}$$

$$i = \frac{P}{u} \tag{10}$$

$$di = \frac{\delta i}{\delta P} dP + \frac{\delta i}{\delta u} du \tag{11}$$

$$= \frac{\delta i}{\delta u} du \tag{12}$$

$$= -\frac{P}{v_0^2} du \tag{13}$$

$$\sum_m \frac{\delta U_i}{\delta i_m^{(k)}} \Delta i_m^{(k)} = \sum_m \frac{\delta U_i}{\delta i_m^{(k)}} \frac{-P_m}{u_m^{(0)2}} \Delta u_m^{(k)} \tag{14}$$

$$= \sum_m r_{i,m} g_m \Delta u_m^{(k)} \tag{15}$$

$$|u_i^{(k)}| = |u_i^{(0)}| + \sum_m \frac{\delta U_i}{\delta i_m^{(k)}} \Delta i_m^{(k)} + \sum_j v_{i,j}\ddot{u}_j^{(k)} \tag{16}$$

$$= |u_i^{(0)}| + \sum_m r_{i,m} g_m \Delta u_m^{(k)} + \sum_j v_{i,j}\ddot{u}_j^{(k)} \tag{17}$$

$$= |u_i^{(0)}| + \sum_m r_{i,m} g_m (|u_m^{(k)}| - u_m^{(0)}|) + \sum_j v_{i,j}\ddot{u}_j^{(k)} \tag{18}$$

$$|u_i^{(k)}| = |u_i^{(0)}| + \sum_j v_{i,j}\ddot{u}_j^{(k)} \tag{19}$$

$$= |u_i^{(0)}| + \sum_j k_{i,j} r_j^{(k)} \Delta u_j \tag{20}$$

$$k_{i,j} \in [0, 1] \tag{21}$$

$$k_{i,j} = \begin{cases} 0 & \text{for } \frac{||u_i^{(r_j \neq 0)}| - |u_i^{(r_j = 0)}||}{\Delta u_j} \leq \epsilon \\ 1 & \text{for } \frac{||u_i^{(r_j \neq 0)}| - |u_i^{(r_j = 0)}||}{\Delta u_j} > \epsilon \end{cases} \tag{22}$$

$$\text{Substation transformer } \Delta u_i = 2\% \tag{23}$$

$$r_j^{(k)} \in [-9, \ldots, 0, \ldots 9] \tag{24}$$

$$ONS \Delta u_i = 2.5\% \tag{25}$$

$$r_j \in [-2, -1, 0, 1, 2] \tag{26}$$

$$RONT \Delta u_i = 1\% \tag{27}$$

$$r_j^{(k)} = [0, 1, \ldots, 7] \tag{28}$$

$$\text{Network controller } \Delta u_i = 1\% \tag{29}$$

$$r_j^{(k)} = [-4, \ldots, 0, \ldots, 4] \tag{30}$$

$$u_i^{(k)} \leq 110 \tag{31}$$

$$u_i^{(k)} \geq 90 \tag{32}$$

$$\tag{33}$$

$$b_{RONT,j} \in [0, 1] \tag{34}$$

$$b_{RONT,j} = \begin{cases} 1 & r_j^{(k)} \neq r_j^{(l)}, l \neq k \\ 0 & r_j^{(k)} = r_j^{(l)}, l \neq k \end{cases} \tag{35}$$

$$b_{NR,j} \in [0, 1] \tag{36}$$

$$b_{NR,j} = 1 \text{ and } r_j \neq 0 \tag{37}$$

$$O = \text{Min}\left(\sum_j b_{RONT,j} C_{RONT,j} + \sum_j b_{NR,j} C_{NR,j}\right) \tag{38}$$

$$|u_i^{(k)}| = |u_i^{(0)}| + r_{i,i} g_i (|u_m^{(k)}| - |u_i^{(0)}|) + \sum_j v_{i,j}\ddot{u}_j^{(k)} \tag{39}$$

$$g_i = \frac{-s_i}{u_0^2} \tag{40}$$

$$\text{High-voltage } \Delta u_i = 2.5\% \tag{41}$$

$$r_j^{(l)} = r_j^{(k)} \varepsilon [-2, -1, 0, 1, 2] \tag{42}$$

$$\text{Low-voltage } \Delta u_i = 3.57\% \tag{43}$$

$$r_j^{(k)} = [-1, 0, 1] \tag{44}$$

$$C_{RONT,j} = 22000 \tag{45}$$

$$OS \Delta u_i = 2.5\% \tag{46}$$

$$r_j^{(l)} = r_j^{(k)} \varepsilon [-2, -1, 0, 1, 2] \tag{47}$$

$$OS, RONT \Delta u_i = 2.5\% \tag{48}$$

$$r_j^{(k)} + r_j^{(l)} = [-4, \ldots, 0, \ldots, 4] \tag{49}$$

$$C_{RONT,j} = 25000 \tag{50}$$

$$OS \Delta u_i = 2.5\% \tag{51}$$

$$r_j^{(l)} + r_j^{(k)} \varepsilon [-2, -1, 0, 1, 2] \tag{52}$$

$$US \Delta u_i = 1\% \tag{53}$$

-continued $$r_j^{(k)} = [0 \ldots 7] \quad (54)$$

$$C_{RONT,j} = 25000 \text{(assumed)} \quad (55)$$

The following results for the network controller variant:

$$US\Delta u_i = 1\% \quad (56)$$

$$r_j^{(k)} = [0 \ldots 7] \quad (57)$$

$$C_{NR,j} = 15000 \text{(assumed)} \quad (58)$$

$$US\Delta u_i = 2.6\% \quad (59)$$

$$r_j^{(k)} = [-6, \ldots, 0, \ldots, 6] \quad (60)$$

$$C_{NR,j} = 16000 \quad (61)$$

$$|u_i^{(k)}| = |u_i^{(0)}| + \sum_j v_{i,j} u_j^{(k)} \quad (62)$$

$$= |u_i^{(0)}| + \sum_j k_{i,j} r_j^{(k)} \Delta u_j \quad (63)$$

$$= |u_i^{(0)}| + \sum_j k_{i,j} r_j^{(k)} \Delta u_j + \sum_s \sum_j k_{i,j} r_{j,s}^{(k)} \Delta u_{j,s} \quad (64)$$

$$O = \text{Min}\left(\sum_j b_{RONT,j} C_{RONT,j} + \sum_j b_{NR,j} C_{NR,j} + \sum_i p_i\right) \quad (65)$$

$$p_i = ||u_i^{(k)}| - u_{soll}| \quad (66)$$

$$O = \text{Min}\left(\sum_i q_i + \sum_i p_i\right) \quad (67)$$

$$p_i = ||u_i^{(k)}| - u_{soll}| \quad (68)$$

$$q_i = \begin{cases} 0 & 90 \leq |u_i^{(k)}| \leq 110 \\ C_i & \text{else} \end{cases} \quad (69)$$

The invention claimed is:

1. A method for retrofitting an existing electrical energy network with additional voltage controllable devices, which comprises the steps of:
generating a model of the existing electrical energy network, the model taking into account a voltage distribution inside the existing electrical energy network by means of at least one of a system of equations or a system of inequations on a basis of a number and position of the additional voltage controllable devices and on a basis of control positions of all voltage controllable devices;
performing a simulation, wherein the model is used to carry out the simulation for minimizing a target function, the target function taking into account at least one of retrofitting effort or energy losses caused by the additional voltage controllable devices being controllable in a stepwise manner or an infinitely variable manner and transmitting energy into the existing electrical energy network, the performing step including the sub-steps of:
simulating the existing electrical energy network by operating alternatively with:
a) a maximum load and a minimum supply power; and
b) a minimum load and a maximum supply power;
stating in a result of the simulation, the number and the position of the additional voltage controllable devices and the control positions of all the voltage controllable devices so that the existing electrical energy network complies with a predefined voltage band during operation, wherein a specific type of device from a specific manufacturer is stated in the result of the simulation for each additional voltage controllable device after different types of devices from various manufacturers have been used in the model to determine which type of device from which manufacturer is most effective for maintaining a voltage level and being a most cost efficient variant; and
placing the number of the additional voltage controllable devices within the existing electrical energy network at positions identified in the result of the simulation.

2. The method according to claim 1, which further comprises using the result of the simulation to retrofit each of the additional voltage controllable devices at a stated position in the existing electrical energy network.

3. The method according to claim 1, wherein the voltage controllable devices are selected from the group consisting of a substation transformer with a controllable output voltage, local network transformers which can be controlled in a stepwise manner, and local network transformers which can be controlled in an infinitely variable manner.

4. The method according to claim 1, wherein the predefined voltage band is +/−10% of a predefined nominal voltage of the existing electrical energy network.

5. The method according to claim 1, wherein the performing step includes the sub-step of minimizing the target function by means of mixed-integer optimization.

6. The method according to claim 5, which further comprises using a branch & bound method as the mixed-integer optimization.

7. A computer-readable medium storing a non-transitory computer program product causes at least one of a computer as a data processing configuration or a cloud-based data processing configuration to carry out a method for retrofitting an existing electrical energy network with additional voltage controllable devices, which comprises the steps of:
generating a model of the existing electrical energy network, the model taking into account a voltage distribution inside the existing electrical energy network by means of at least one of a system of equations or a system of inequations on a basis of a number and position of the additional voltage controllable devices and on a basis of control positions of all voltage controllable devices;
performing a simulation, wherein the model is used to carry out the simulation for minimizing a target function, the target function taking into account at least one of retrofitting effort or energy losses caused by the additional voltage controllable devices being controllable in a stepwise manner or an infinitely variable manner and transmitting energy into the existing electrical energy network, the performing step including the sub-steps of:
simulating the existing electrical energy network by operating alternatively with:
a) a maximum load and a minimum supply power; and
b) a minimum load and a maximum supply power;
stating in a result of the simulation the number and the position of the additional voltage controllable devices and the control positions of all the voltage controllable devices so that the existing electrical energy network complies with a predefined voltage band during operation, wherein a specific type of device from a specific manufacturer is stated in the result of the simulation for each additional voltage controllable device after different types of devices from various manufacturers have been used in the model to determine which type of device from which manufacturer is most effective for maintaining a voltage level and being a most cost efficient variant; and initiating a placement of the number of the additional controllable devices within the existing electrical energy network at positions identified in the result of the simulation.

8. A method for optimizing an existing electrical energy network for transmitting energy with voltage controllable devices and a device which can be dynamically controlled under load, which comprises the steps of:

generating a model of the existing electrical energy network, the model taking into account a voltage distribution inside the existing electrical energy network by means of at least one of a system of equations or a system of inequations on a basis of control positions of the voltage controllable devices and the device which can be dynamically controlled under load; and carrying out a simulation using the model for minimizing a target function, the target function taking into account compliance with a predefined voltage band during operation when the energy is supplied to the existing electrical energy network in a decentralized manner, and the control positions of all the voltage controllable devices and of the device which can be dynamically controlled under load are stated in a result of the simulation and transmitting energy into the existing electrical energy network, wherein a specific type of device from a specific manufacturer is stated in the result of the simulation for each additional voltage controllable device after different types of devices from various manufacturers have been used in the model to determine which type of device from which manufacturer is most effective for maintaining a voltage level and being a most cost efficient variant, the carrying out step including the sub-steps of:

simulating the existing electrical energy network by operating alternatively with:
a) a maximum load and a minimum supply power; and
b) a minimum load and a maximum supply power.

9. The method according to claim 8, which further comprises providing a substation transformer which can be dynamically controlled for different operating situations of the existing electrical energy network as the device which can be dynamically controlled under load, with a result that wide-range control of a voltage in the existing electrical energy network can be carried out.

* * * * *